US006660126B2

(12) United States Patent
Nguyen et al.

(10) Patent No.: US 6,660,126 B2
(45) Date of Patent: *Dec. 9, 2003

(54) LID ASSEMBLY FOR A PROCESSING SYSTEM TO FACILITATE SEQUENTIAL DEPOSITION TECHNIQUES

(75) Inventors: Anh N. Nguyen, Milpitas, CA (US); Michael X. Yang, Palo Alto, CA (US); Ming Xi, Milpitas, CA (US); Hua Chung, San Jose, CA (US); Anzhong Chang, San Jose, CA (US); Xiaoxiong Yuan, Cupertino, CA (US); Siqing Lu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 176 days.

This patent is subject to a terminal disclaimer.

(21) Appl. No.: 09/798,251

(22) Filed: Mar. 2, 2001

(65) Prior Publication Data

US 2002/0121342 A1 Sep. 5, 2002

(51) Int. Cl.$^7$ .......................... H05H 1/00; C23C 16/00
(52) U.S. Cl. ............................ 156/345.34; 156/345.33; 118/715
(58) Field of Search ..................... 118/715; 156/345.33, 156/345.34

(56) References Cited

U.S. PATENT DOCUMENTS

| 3,603,284 A | * | 9/1971 | Garnache ..................... 118/725 |
| 4,058,430 A | | 11/1977 | Suntola et al. ............... 156/611 |
| 4,389,973 A | | 6/1983 | Suntola et al. ............... 118/725 |
| 4,413,022 A | | 11/1983 | Suntola et al. ............ 427/255.2 |
| 4,486,487 A | | 12/1984 | Skarp ........................ 428/216 |

(List continued on next page.)

FOREIGN PATENT DOCUMENTS

| DE | 196 27 017 | 1/1997 | ......... H01L/21/283 |
| DE | 198 20 147 | 7/1999 | ....... H01L/21/3205 |
| EP | 0 344 352 A1 | 12/1989 | ........... H01L/39/24 |
| EP | 0 429 270 A2 | 5/1991 | ............. G03F/7/36 |
| EP | 0 442 490 A1 | 8/1991 | ........... C30B/25/02 |

(List continued on next page.)

OTHER PUBLICATIONS

PCT International Search Report from application No. PCT/US 02/05647 dated Jul. 24, 2002.
"Cluster Tools for Fabrication of Advanced devices" Jap. J. of Applied Physics, Extended Abstracts, 22$^{nd}$ Conference Solid State Devices and Materials (1990), pp. 849–852.
"Applications of Integrated processing", Solid State Technology, US, Cowan Pub., vol. 37, No. 12 (Dec. 1, 1994), pp. 45–47.
Kitigawa, et al., "Hydrogen–mediated low temperature epitaxy of Si in plasma–enhanced chemical vapor deposition", Applied Surface Science (2000), pp. 30–34.
Hultman, et al., "Review of the thermal and mechanical stability of TiN–based thin films", *Zeitschrift Fur Metallkunde,* 90(10) (Oct. 1999), pp. 803–813.

(List continued on next page.)

*Primary Examiner*—Parviz Hassanzadel
*Assistant Examiner*—Karla Moore
(74) *Attorney, Agent, or Firm*—Moser, Patterson & Sheridan

(57) ABSTRACT

A lid for a semiconductor system, an exemplary embodiment of which includes a support having opposed first and second opposed surfaces. A valve is coupled to the first surface. A baffle plate is mounted to the second surface. The valve is coupled to the support to direct a flow of fluid along a path in original direction and at an injection velocity. The baffle plate is disposed in the path to disperse the flow of fluid in a plane extending transversely to the original direction. In one embodiment the valve is mounted to a W-seal that is in turn mounted to the first surface of the support.

28 Claims, 11 Drawing Sheets

U.S. PATENT DOCUMENTS

| | | | | |
|---|---|---|---|---|
| 4,718,976 A | * | 1/1988 | Fujimura | 216/67 |
| 4,767,494 A | | 8/1988 | Kobayashi et al. | 156/606 |
| 4,806,321 A | | 2/1989 | Nishizawa et al. | 422/245 |
| 4,813,846 A | | 3/1989 | Helms | 414/744.1 |
| 4,829,022 A | | 5/1989 | Kobayashi et al. | 437/107 |
| 4,834,831 A | | 5/1989 | Nishizawa et al. | 156/611 |
| 4,838,983 A | | 6/1989 | Schumaker et al. | 156/613 |
| 4,838,993 A | | 6/1989 | Aoki et al. | 156/643 |
| 4,840,921 A | | 6/1989 | Matsumoto | 437/89 |
| 4,845,049 A | | 7/1989 | Sunakawa | 437/81 |
| 4,859,625 A | | 8/1989 | Matsumoto | 437/81 |
| 4,859,627 A | | 8/1989 | Sunakawa | 437/81 |
| 4,861,417 A | | 8/1989 | Mochizuki et al. | 156/610 |
| 4,876,218 A | | 10/1989 | Pessa et al. | 437/107 |
| 4,917,556 A | | 4/1990 | Stark et al. | 414/217 |
| 4,927,670 A | | 5/1990 | Erbil | 427/255.3 |
| 4,931,132 A | | 6/1990 | Aspnes et al. | 156/601 |
| 4,951,601 A | | 8/1990 | Maydan et al. | 118/719 |
| 4,960,720 A | | 10/1990 | Shimbo | 437/105 |
| 4,975,252 A | | 12/1990 | Nishizawa et al. | 422/245 |
| 4,977,855 A | * | 12/1990 | Ohmi et al. | 142/10 |
| 4,993,357 A | | 2/1991 | Scholz | 118/715 |
| 5,000,113 A | | 3/1991 | Wang et al. | 118/723 |
| 5,013,683 A | | 5/1991 | Petroff et al. | 437/110 |
| 5,028,565 A | | 7/1991 | Chang et al. | 437/192 |
| 5,082,798 A | | 1/1992 | Arimoto | 437/108 |
| 5,085,885 A | | 2/1992 | Foley et al. | 477/38 |
| 5,091,320 A | | 2/1992 | Aspnes et al. | 437/8 |
| 5,130,269 A | | 7/1992 | Kitahara et al. | 437/111 |
| 5,166,092 A | | 11/1992 | Mochizuki et al. | 437/105 |
| 5,173,474 A | | 12/1992 | Connell et al. | 505/1 |
| 5,186,718 A | | 2/1993 | Tepman et al. | 29/25.01 |
| 5,205,077 A | | 4/1993 | Wittstock | 51/165 R |
| 5,225,366 A | | 7/1993 | Yoder | 437/108 |
| 5,234,561 A | | 8/1993 | Randhawa et al. | 204/192.38 |
| 5,246,536 A | | 9/1993 | Nishizawa et al. | 156/610 |
| 5,250,148 A | | 10/1993 | Nishizawa et al. | 156/611 |
| 5,254,207 A | | 10/1993 | Nishizawa et al. | 156/601 |
| 5,256,244 A | | 10/1993 | Ackerman | 156/613 |
| 5,259,881 A | | 11/1993 | Edwards et al. | 118/719 |
| 5,270,247 A | | 12/1993 | Sakuma et al. | 437/133 |
| 5,278,435 A | | 1/1994 | Van Hove et al. | 257/184 |
| 5,281,274 A | | 1/1994 | Yoder | 118/697 |
| 5,286,296 A | | 2/1994 | Sato et al. | 118/719 |
| 5,290,748 A | | 3/1994 | Knuuttila et al. | 502/228 |
| 5,294,286 A | | 3/1994 | Nishizawa et al. | 156/610 |
| 5,296,403 A | | 3/1994 | Nishizawa et al. | 437/133 |
| 5,300,186 A | | 4/1994 | Kitahara et al. | 156/613 |
| 5,311,055 A | | 5/1994 | Goodman et al. | 257/593 |
| 5,316,615 A | | 5/1994 | Copel et al. | 117/95 |
| 5,316,793 A | | 5/1994 | Wallace et al. | 427/248.1 |
| 5,330,610 A | | 7/1994 | Eres et al. | 117/86 |
| 5,336,324 A | | 8/1994 | Stall et al. | 118/719 |
| 5,338,389 A | | 8/1994 | Nishizawa et al. | 117/89 |
| 5,348,911 A | | 9/1994 | Jurgensen et al. | 117/91 |
| 5,374,570 A | | 12/1994 | Nasu et al. | 437/40 |
| 5,395,791 A | | 3/1995 | Cheng et al. | 437/105 |
| 5,438,952 A | | 8/1995 | Otsuka | 117/84 |
| 5,439,876 A | | 8/1995 | Graf et al. | 505/447 |
| 5,441,568 A | * | 8/1995 | Cho et al. | 118/715 |
| 5,441,703 A | | 8/1995 | Jurgensen | 422/129 |
| 5,443,033 A | | 8/1995 | Nishizawa et al. | 117/86 |
| 5,443,647 A | | 8/1995 | Aucoin et al. | 118/723 ME |
| 5,455,072 A | | 10/1995 | Bension et al. | 427/255.7 |
| 5,458,084 A | | 10/1995 | Thorne et al. | 117/89 |
| 5,469,806 A | | 11/1995 | Mochizuki et al. | 117/97 |
| 5,480,818 A | | 1/1996 | Matsumoto et al. | 437/40 |
| 5,483,919 A | | 1/1996 | Yokoyama et al. | 117/89 |
| 5,484,664 A | | 1/1996 | Kitahara et al. | 428/641 |
| 5,494,522 A | * | 2/1996 | Moriya et al. | 118/719 |
| 5,503,875 A | | 4/1996 | Imai et al. | 427/255.3 |
| 5,521,126 A | | 5/1996 | Okamura et al. | 437/235 |
| 5,527,733 A | | 6/1996 | Nishizawa et al. | 437/160 |
| 5,532,511 A | | 7/1996 | Nishizawa et al. | 257/627 |
| 5,540,783 A | | 7/1996 | Eres et al. | 118/725 |
| 5,580,380 A | | 12/1996 | Liu et al. | 117/86 |
| 5,601,651 A | | 2/1997 | Watabe | 118/715 |
| 5,609,689 A | | 3/1997 | Kato et al. | 118/719 |
| 5,616,181 A | | 4/1997 | Yamamoto et al. | 118/723 ER |
| 5,637,530 A | | 6/1997 | Gaines et al. | 114/105 |
| 5,641,984 A | | 6/1997 | Aftergut et al. | 257/433 |
| 5,644,128 A | | 7/1997 | Wollnik et al. | 250/251 |
| 5,667,592 A | | 9/1997 | Boitnott et al. | 118/719 |
| 5,674,786 A | | 10/1997 | Turner et al. | 437/225 |
| 5,693,139 A | | 12/1997 | Nishizawa et al. | 117/89 |
| 5,695,564 A | | 12/1997 | Imahashi | 118/719 |
| 5,705,224 A | | 1/1998 | Murota et al. | 427/248.1 |
| 5,707,880 A | | 1/1998 | Aftergut et al. | 437/3 |
| 5,711,811 A | | 1/1998 | Suntola et al. | 118/711 |
| 5,730,801 A | | 3/1998 | Tepman et al. | 118/719 |
| 5,730,802 A | | 3/1998 | Ishizumi et al. | 118/719 |
| 5,747,113 A | | 5/1998 | Tsai | 427/255.5 |
| 5,749,974 A | | 5/1998 | Habuka et al. | 118/725 |
| 5,788,447 A | | 8/1998 | Yonemitsu et al. | 414/217 |
| 5,788,799 A | | 8/1998 | Steger et al. | 156/345 |
| 5,796,116 A | | 8/1998 | Nakata et al. | 257/66 |
| 5,801,634 A | | 9/1998 | Young et al. | 340/635 |
| 5,807,792 A | | 9/1998 | Ilg et al. | 438/758 |
| 5,830,270 A | | 11/1998 | McKee et al. | 117/106 |
| 5,835,677 A | | 11/1998 | Li et al. | 392/401 |
| 5,851,849 A | | 12/1998 | Comizzoli et al. | 438/38 |
| 5,855,675 A | | 1/1999 | Doering et al. | 118/719 |
| 5,855,680 A | | 1/1999 | Soininen et al. | 118/719 |
| 5,856,219 A | | 1/1999 | Naito et al. | 438/241 |
| 5,858,102 A | | 1/1999 | Tsai | 118/719 |
| 5,866,213 A | | 2/1999 | Foster et al. | 427/573 |
| 5,866,795 A | | 2/1999 | Wang et al. | 73/1.36 |
| 5,879,459 A | | 3/1999 | Gadgil et al. | 118/715 |
| 5,882,165 A | | 3/1999 | Maydan et al. | 414/217 |
| 5,882,413 A | | 3/1999 | Beaulieu et al. | 118/719 |
| 5,904,565 A | | 5/1999 | Nguyen et al. | 438/687 |
| 5,916,365 A | | 6/1999 | Sherman | 117/92 |
| 5,923,056 A | | 7/1999 | Lee et al. | 257/192 |
| 5,923,985 A | | 7/1999 | Aoki et al. | 438/301 |
| 5,925,574 A | | 7/1999 | Aoki et al. | 437/31 |
| 5,928,389 A | | 7/1999 | Jevtic | 29/25.01 |
| 5,942,040 A | | 8/1999 | Kim et al. | 118/726 |
| 5,947,710 A | | 9/1999 | Cooper et al. | 418/63 |
| 5,951,776 A | | 9/1999 | Selyutin et al. | 118/729 |
| 5,972,430 A | | 10/1999 | DiMeo, Jr. et al. | 427/255.32 |
| 5,976,308 A | * | 11/1999 | Fairbairn et al. | 156/345 |
| 6,001,669 A | | 12/1999 | Gaines et al. | 438/102 |
| 6,015,590 A | | 1/2000 | Suntola et al. | 427/255.23 |
| 6,025,627 A | | 2/2000 | Forbes et al. | 257/321 |
| 6,036,773 A | | 3/2000 | Wang et al. | 117/97 |
| 6,041,733 A | * | 3/2000 | Kim et al. | 118/723 E |
| 6,042,652 A | | 3/2000 | Hyun et al. | 118/719 |
| 6,043,177 A | | 3/2000 | Falconer et al. | 502/4 |
| 6,051,286 A | | 4/2000 | Zhao et al. | 427/576 |
| 6,062,798 A | | 5/2000 | Muka | 414/416 |
| 6,071,808 A | | 6/2000 | Merchant et al. | 438/633 |
| 6,084,302 A | | 7/2000 | Sandhu | 257/751 |
| 6,086,677 A | | 7/2000 | Umotoy et al. | 118/715 |
| 6,110,556 A | * | 8/2000 | Bang et al. | 428/64.1 |
| 6,113,977 A | | 9/2000 | Soininen et al. | 427/64 |
| 6,117,244 A | | 9/2000 | Bang et al. | 118/715 |
| 6,124,158 A | | 9/2000 | Dautartas et al. | 438/216 |
| 6,130,147 A | | 10/2000 | Major et al. | 438/604 |
| 6,139,700 A | | 10/2000 | Kang et al. | 204/192.17 |
| 6,140,237 A | | 10/2000 | Chan et al. | 438/687 |
| 6,140,238 A | | 10/2000 | Kitch | 438/687 |

| | | | | |
|---|---|---|---|---|
| 6,143,659 A | 11/2000 | Leem ........................ 438/688 |
| 6,144,060 A | 11/2000 | Park et al. .................. 257/310 |
| 6,158,446 A | 12/2000 | Mohindra et al. .......... 134/25.4 |
| 6,174,377 B1 | 1/2001 | Doering et al. ............. 118/729 |
| 6,174,809 B1 | 1/2001 | Kang et al. .................. 438/682 |
| 6,182,603 B1 * | 2/2001 | Shang et al. ......... 118/723 ME |
| 6,183,563 B1 * | 2/2001 | Choi et al. .................. 118/715 |
| 6,200,893 B1 | 3/2001 | Sneh ........................... 438/685 |
| 6,203,613 B1 | 3/2001 | Gates et al. ................. 117/104 |
| 6,206,967 B1 | 3/2001 | Mak et al. ................... 118/666 |
| 6,207,302 B1 | 3/2001 | Sugiura et al. .............. 428/690 |
| 6,231,672 B1 | 5/2001 | Choi et al. .................. 118/715 |
| 6,245,192 B1 * | 6/2001 | Dhindsa et al. ......... 156/345.34 |
| 6,248,605 B1 | 6/2001 | Harkonen et al. ............ 438/29 |
| 6,270,572 B1 | 8/2001 | Kim et al. ..................... 117/93 |
| 6,271,148 B1 | 8/2001 | Kao et al. .................... 438/727 |
| 6,287,965 B1 | 9/2001 | Kang et al. ................. 438/648 |
| 6,291,876 B1 | 9/2001 | Stumborg et al. ............ 257/632 |
| 6,305,314 B1 | 10/2001 | Sneh et al. ............. 118/723 R |
| 6,306,216 B1 | 10/2001 | Kim et al. ................... 118/725 |
| 6,316,098 B1 | 11/2001 | Yitzchaik et al. ............ 428/339 |
| 6,436,253 B1 * | 8/2002 | Yang et al. ............. 204/298.33 |
| 6,447,607 B2 | 9/2002 | Soininen et al. ............. 117/200 |
| 6,478,872 B1 | 11/2002 | Chae et al. .................... 117/88 |
| 6,481,945 B1 | 11/2002 | Hasper et al. ............... 414/217 |
| 6,511,539 B1 | 1/2003 | Raaijmakers ................ 117/102 |
| 6,551,406 B2 | 4/2003 | Kilpi ........................... 118/728 |
| 2001/0000866 A1 | 5/2001 | Sneh et al. ............. 118/723 R |
| 2001/0009140 A1 | 7/2001 | Bondestam et al. ........ 118/725 |
| 2001/0011526 A1 | 8/2001 | Doering et al. ............. 118/729 |
| 2001/0013312 A1 | 8/2001 | Soininen et al. ............. 117/26 |
| 2001/0014371 A1 | 8/2001 | Kilpi ..................... 427/255.28 |
| 2001/0031562 A1 | 10/2001 | Raaijmakers et al. ....... 438/770 |
| 2001/0034123 A1 | 10/2001 | Jeon et al. ................... 438/643 |
| 2001/0041250 A1 | 11/2001 | Werkhoven et al. ........ 428/212 |
| 2001/0042523 A1 | 11/2001 | Kesala ........................ 122/6.6 |
| 2001/0042799 A1 | 11/2001 | Kim et al. ................... 239/553 |
| 2001/0054377 A1 | 12/2001 | Lindfors et al. ............. 117/104 |
| 2002/0000196 A1 | 1/2002 | Park ........................... 118/715 |
| 2002/0007790 A1 | 1/2002 | Park ........................... 118/715 |
| 2002/0041931 A1 | 4/2002 | Suntola et al. ......... 427/255.28 |
| 2002/0052097 A1 | 5/2002 | Park ........................... 438/507 |
| 2002/0086106 A1 | 7/2002 | Park et al. ................ 427/248.1 |
| 2002/0092471 A1 | 7/2002 | Kang et al. ................. 118/715 |
| 2002/0094689 A1 | 7/2002 | Park ........................... 438/694 |
| 2002/0108570 A1 | 8/2002 | Lindfors ..................... 118/715 |
| 2002/0121241 A1 * | 9/2002 | Nguyen et al. .............. 118/715 |
| 2002/0134307 A1 | 9/2002 | Choi ........................... 118/715 |
| 2003/0004723 A1 | 1/2003 | Chihara ....................... 704/260 |
| 2003/0075273 A1 | 4/2003 | Kilpela et al. ........... 156/345.33 |
| 2003/0075925 A1 | 4/2003 | Lindfors et al. ............. 285/367 |

FOREIGN PATENT DOCUMENTS

| | | | | |
|---|---|---|---|---|
| EP | 0 709 875 A1 * | 5/1996 | ............ H01J/37/32 |
| EP | 0768702 A1 | 4/1997 | ............ H01J/37/32 |
| EP | 0 799 641 A2 | 10/1997 | ............ B01J/20/32 |
| EP | 1 167 569 | 1/2002 | ......... C23C/16/455 |
| FR | 2 626 110 | 7/1989 | ............ H01L/39/24 |
| FR | 2 692 597 | 12/1993 | ........... C23C/16/00 |
| GB | 2 355 727 A | 5/2001 | ........... C23C/16/44 |
| JP | 58-098917 | 6/1983 | ........... H01L/2/205 |
| JP | 58-100419 | 6/1983 | ........... H01L/21/20 |
| JP | 60-065712 A | 4/1985 | ......... C01B/33/113 |
| JP | 61-035847 | 2/1986 | ............ B01J/19/08 |
| JP | 61-210623 | 9/1986 | ......... H01L/21/205 |
| JP | 62-0695508 | 3/1987 | ......... H01L/21/203 |
| JP | 62-091495 A1 | 4/1987 | ............ C30B/25/02 |
| JP | 62/14717 | 6/1987 | ......... H01L/21/203 |
| JP | 62-167297 | 7/1987 | ........... C30B/29/40 |
| JP | 62-171999 | 7/1987 | ........... C30B/29/40 |
| JP | 62-232919 | 10/1987 | ......... H01L/21/205 |
| JP | 63-062313 | 3/1988 | ......... H01L/21/203 |
| JP | 63-085098 | 4/1988 | ........... C30B/21/40 |
| JP | 63-090833 | 4/1988 | ......... H01L/21/365 |
| JP | 10-190128 | 7/1988 | ............. H01S/3/18 |
| JP | 63-222420 | 9/1988 | ......... H01L/21/205 |
| JP | 63-222421 | 9/1988 | ......... H01L/21/205 |
| JP | 63-227007 | 9/1988 | ......... H01L/21/205 |
| JP | 63-252420 | 10/1988 | ......... H01L/21/205 |
| JP | 63-266814 | 11/1988 | ......... H01L/21/205 |
| JP | 64-009895 | 1/1989 | ........... C30B/29/40 |
| JP | 64-009896 | 1/1989 | ........... C30B/29/40 |
| JP | 64-009897 | 1/1989 | ........... C30B/29/40 |
| JP | 64-037832 | 2/1989 | ......... H01L/21/205 |
| JP | 64-082615 | 3/1989 | ......... H01L/21/205 |
| JP | 64-082617 | 3/1989 | ......... H01L/21/205 |
| JP | 64-082671 | 3/1989 | ........... H01L/29/78 |
| JP | 64-082676 | 3/1989 | ........... H01L/29/80 |
| JP | 01-103982 | 4/1989 | ........... C30B/23/08 |
| JP | 01-103996 | 4/1989 | ........... C30B/29/40 |
| JP | 64-090524 | 4/1989 | ......... H01L/21/205 |
| JP | 01-117017 | 5/1989 | ......... H01L/21/203 |
| JP | 01-143221 | 6/1989 | ......... H01L/21/314 |
| JP | 01-143233 | 6/1989 | ........... H01L/21/76 |
| JP | 01-154511 | 6/1989 | ........... H01L/21/20 |
| JP | 01-236657 | 9/1989 | ........... H01L/29/80 |
| JP | 01-245512 | 9/1989 | ......... H01L/21/205 |
| JP | 01-264218 | 10/1989 | ......... H01L/21/205 |
| JP | 01-270593 | 10/1989 | ............ C30B/25/02 |
| JP | 01-272108 | 10/1989 | ......... H01L/21/203 |
| JP | 01-290221 | 11/1989 | ......... H01L/21/205 |
| JP | 01-290222 | 11/1989 | ......... H01L/21/205 |
| JP | 01-296673 | 11/1989 | ........... H01L/29/88 |
| JP | 01-303770 | 12/1989 | ........... H01L/39/24 |
| JP | 01-305894 | 12/1989 | ........... C30B/23/08 |
| JP | 01-313927 | 12/1989 | ......... H01L/21/205 |
| JP | 02-012814 | 1/1990 | ......... H01L/21/205 |
| JP | 02-014513 | 1/1990 | ......... H01L/21/205 |
| JP | 02-017634 | 1/1990 | ......... H01L/21/225 |
| JP | 02-063115 | 3/1990 | ........... H01L/21/20 |
| JP | 02-074029 | 3/1990 | ......... H01L/21/205 |
| JP | 02-074587 | 3/1990 | ........... C30B/23/08 |
| JP | 02-106822 | 4/1990 | ........... H01B/13/00 |
| JP | 02-129913 | 5/1990 | ......... H01L/21/205 |
| JP | 02-162717 | 6/1990 | ........... H01L/21/20 |
| JP | 02-172895 | 7/1990 | ........... C30B/29/36 |
| JP | 02-196092 | 8/1990 | ........... C30B/25/14 |
| JP | 02-203517 | 8/1990 | ......... H01L/21/205 |
| JP | 02-230690 | 9/1990 | ........... H05B/33/10 |
| JP | 02-230722 | 9/1990 | ......... H01L/21/205 |
| JP | 02-64491 | 10/1990 | ............. H01S/3/18 |
| JP | 02-246161 | 10/1990 | ......... H01L/29/784 |
| JP | 02-283084 | 11/1990 | ............. H01S/3/18 |
| JP | 02-304916 | 12/1990 | ......... H01L/21/205 |
| JP | 03-019211 | 1/1991 | ......... H01L/21/205 |
| JP | 03-022569 | 1/1991 | ........... H01L/29/804 |
| JP | 03-023294 | 1/1991 | ........... C30B/25/18 |
| JP | 03-023299 | 1/1991 | ........... C30B/29/40 |
| JP | 03-044967 | 2/1991 | ........... H01L/29/48 |
| JP | 03-048421 | 3/1991 | ......... H01L/21/302 |
| JP | 03-070124 | 3/1991 | ......... H01L/21/205 |
| JP | 03-185716 | 8/1991 | ......... H01L/21/205 |
| JP | 03-208885 | 9/1991 | ........... C30B/23/02 |
| JP | 03-234025 | 10/1991 | ......... H01L/21/318 |
| JP | 03-286522 | 12/1991 | ......... H01L/21/205 |
| JP | 03-286531 | 12/1991 | ......... H01L/21/316 |
| JP | 04-031391 | 2/1992 | ........... C30B/23/08 |
| JP | 04-031396 | 2/1992 | ........... C30B/25/14 |
| JP | 04-0313696 A | 2/1992 | ........... C30B/25/14 |
| JP | 04-100292 | 4/1992 | ............. H01S/3/18 |
| JP | 04-111418 | 4/1992 | ......... H01L/21/205 |
| JP | 04-132214 | 5/1992 | ......... H01L/21/205 |

| | | | | | | | | |
|---|---|---|---|---|---|---|---|---|
| JP | 04-132681 | 5/1992 | C30B/25/14 | JP | 2001-240972 | 9/2001 | C23C/16/458 |
| JP | 04-151822 | 5/1992 | H01L/21/205 | JP | 2001-254181 | 9/2001 | C23C/16/46 |
| JP | 04-162418 | 6/1992 | H01L/21/205 | JP | 2001-284042 | 10/2001 | H05B/33/04 |
| JP | 04-175299 | 6/1992 | C30B/29/68 | JP | 2001-303251 | 10/2001 | C23C/16/44 |
| JP | 04-186824 | 7/1992 | H01L/21/205 | JP | 2001-328900 | 11/2001 | C30B/29/68 |
| JP | 04-212411 | 8/1992 | H01L/21/203 | WO | 90/02216 | 3/1990 | C23C/14/34 |
| JP | 04-260696 | 9/1992 | C30B/29/40 | WO | 91/10510 A1 | 7/1991 | B01J/37/02 |
| JP | 04-273120 | 9/1992 | H01L/21/20 | WO | 93/02111 A1 | 2/1993 | C08F/4/78 |
| JP | 04-285167 | 10/1992 | C23C/14/54 | WO | 96/18756 A1 | 6/1996 | C23C/16/08 |
| JP | 04-291916 | 10/1992 | H01L/21/205 | WO | 96/171070 A1 | 6/1996 | C23C/16/44 |
| JP | 04-325500 | 11/1992 | C30B/33/00 | WO | 98/06889 | 2/1998 | |
| JP | 04-328874 | 11/1992 | H01L/29/804 | WO | 98/51838 | 11/1998 | C23C/16/06 |
| JP | 05-029228 | 2/1993 | H01L/21/205 | WO | 99/01595 | 1/1999 | C30B/25/14 |
| JP | 05-047665 | 2/1993 | H01L/21/205 | WO | 99/13504 | 3/1999 | H01L/21/68 |
| JP | 05-047666 | 2/1993 | H01L/21/205 | WO | 99/29924 A1 | 6/1999 | C23C/16/04 |
| JP | 05-047668 | 2/1993 | H01L/21/205 | WO | 99/41423 A2 | 8/1999 | |
| JP | 05-074717 | 3/1993 | H01L/21/205 | WO | 99/65064 | 12/1999 | H01L/21/00 |
| JP | 05-074724 | 3/1993 | H01L/21/205 | WO | 00/11721 | 3/2000 | H01L/29/43 |
| JP | 05-102189 | 4/1993 | H01L/21/336 | WO | 00/15865 A1 | 3/2000 | C23C/16/00 |
| JP | 05-160152 | 6/1993 | H01L/21/336 | WO | 00/15881 A2 | 3/2000 | |
| JP | 05-175143 | 7/1993 | H01L/21/205 | WO | 00/16377 A2 | 3/2000 | |
| JP | 05-175145 | 7/1993 | H01L/21/205 | WO | 00/54320 A1 | 9/2000 | H01L/21/44 |
| JP | 05-182906 | 7/1993 | H01L/21/20 | WO | 00/63957 A1 | 10/2000 | H01L/21/205 |
| JP | 05-186295 | 7/1993 | C30B/25/02 | WO | WO00/79019 A1 | 12/2000 | C23C/16/00 |
| JP | 05-206036 | 8/1993 | H01L/21/205 | WO | 00/79019 A1 | 12/2000 | C23C/16/00 |
| JP | 05-234899 | 9/1993 | H01L/21/205 | WO | 00/79576 A1 | 12/2000 | H01L/21/205 |
| JP | 05-235047 | 9/1993 | H01L/21/338 | WO | 01/15220 A1 | 3/2001 | H01L/21/768 |
| JP | 05-251339 | 9/1993 | H01L/21/20 | WO | 01/15220 | 3/2001 | H01L/21/768 |
| JP | 05-270997 | 10/1993 | C30B/29/68 | WO | 01/17692 | 3/2001 | B05C/11/00 |
| JP | 05-283336 | 10/1993 | H01L/21/20 | WO | 01/27346 A1 | 4/2001 | C23C/16/44 |
| JP | 05-291152 | 11/1993 | H01L/21/205 | WO | 01/27347 A1 | 4/2001 | C23C/16/44 |
| JP | 05-304334 | 11/1993 | H01L/3/18 | WO | 01/29280 A1 | 4/2001 | C23C/16/32 |
| JP | 05-343327 | 12/1993 | H01L/21/205 | WO | 01/29891 A1 | 4/2001 | H01L/21/768 |
| JP | 05-343685 | 12/1993 | H01L/29/784 | WO | 01/29893 A1 | 4/2001 | H01L/21/768 |
| JP | 06-045606 | 2/1994 | H01L/29/784 | WO | 01/36702 A1 | 5/2001 | C23C/16/00 |
| JP | 06-132236 | 5/1994 | H01L/21/205 | WO | 01/40541 A1 | 6/2001 | C23C/16/40 |
| JP | 06-177381 | 6/1994 | H01L/29/784 | WO | 01/66832 A2 | 9/2001 | C30B/16/44 |
| JP | 06-196809 | 7/1994 | H01S/3/18 | WO | 02/08488 | 1/2002 | C23C/16/44 |
| JP | 06-222388 | 8/1994 | G02F/1/136 | | | | |
| JP | 06-224138 | 8/1994 | H01L/21/205 | | | | |
| JP | 06-230421 | 8/1994 | G02F/1/136 | | | | |
| JP | 06-252057 | 9/1994 | H01L/21/205 | | | | |
| JP | 06-291048 | 10/1994 | H01L/21/205 | | | | |
| JP | 07-070752 | 3/1995 | C23C/16/40 | | | | |
| JP | 07-086269 | 3/1995 | H01L/21/314 | | | | |
| JP | 08-181076 | 7/1996 | H01L/21/205 | | | | |
| JP | 08-245291 | 9/1996 | C30B/25/14 | | | | |
| JP | 08-264530 | 10/1996 | H01L/21/3205 | | | | |
| JP | 09-260786 | 10/1997 | H01S/3/18 | | | | |
| JP | 09-293681 | 11/1997 | H01L/21/205 | | | | |
| JP | 10-188840 | 7/1998 | H01J/29/18 | | | | |
| JP | 10-308283 | 11/1998 | H05B/33/22 | | | | |
| JP | 11-269652 | 10/1999 | C23C/16/44 | | | | |
| JP | 2000-031387 | 1/2000 | H01L/27/04 | | | | |
| JP | 2000-058777 | 2/2000 | H01L/27/108 | | | | |
| JP | 2000-068072 | 3/2000 | H05B/33/22 | | | | |
| JP | 2000-087029 | 3/2000 | C09K/11/08 | | | | |
| JP | 2000-319772 | 3/2000 | C23C/16/00 | | | | |
| JP | 2000-138094 | 5/2000 | H05B/33/10 | | | | |
| JP | 2000-218445 | 8/2000 | B23P/6/00 | | | | |
| JP | 2000-319772 | 11/2000 | C23C/14/24 | | | | |
| JP | 2000-340883 | 12/2000 | H01S/5/125 | | | | |
| JP | 2000-353666 | 12/2000 | H01L/21/205 | | | | |
| JP | 2001-020075 | 1/2001 | C23C/16/44 | | | | |
| JP | 2001-62244 | 3/2001 | B01D/53/34 | | | | |
| JP | 2001-152339 | 6/2001 | C23C/16/40 | | | | |
| JP | 2001-172767 | 6/2001 | C23C/16/40 | | | | |
| JP | 2001-189312 | 7/2001 | H01L/21/316 | | | | |
| JP | 2001-217206 | 8/2001 | H01L/21/285 | | | | |
| JP | 2001-220287 | 8/2001 | C30B/25/02 | | | | |
| JP | 2001-220294 | 8/2001 | C30B/29/20 | | | | |

OTHER PUBLICATIONS

Klaus, et al., "Atomic Layer Deposition of $SiO_2$ Using Catalyzed and Uncatalyzed Self–Limiting Surface Reactions", *Surface Review & Letters*, 6(3&4) (1999), pp. 435–448.

Yamaguchi, et al., "Atomic–layer chemical–vapor–deposition of silicon dioxide films with extremely low hydrogen content", *Appl. Surf. Sci.*, vol. 130–132 (1998), pp. 202–207.

George, et al., "Surface Chemistry for Atomic Layer Growth", *J. Phys. Chem.*, vol. 100 (1996), pp. 13121–13131.

George, et al., "Atomic layer controlled deposition of $SiO_2$ and $Al_2O_3$ using ABAB . . . binary reaction sequence chemistry", *Appl. Surf. Sci.*, vol. 82/83 (1994), pp. 460–467.

Wise, et al., "Diethyldiethoxysilane as a new precursor for $SiO_2$ growth on silicon", *Mat. Res. Soc. Symp. Proc.*, vol. 334 (1994), pp. 37–43.

Niinisto, et al., "Synthesis of oxide thin films and overlayers by atomic layer epitaxy for advanced applications", *Mat. Sci. & Eng.*, vol. B41 (1996), pp. 23–29.

Ritala, et al., "Perfectly conformal TiN and $Al_2O_3$ films deposited by atomic layer deposition", *Chemical Vapor Deposition*, vol. 5(1) (Jan. 1999), pp. 7–9.

Klaus, et al., "Atomically controlled growth of tungsten and tungsten nitride using sequential surface reactions". *Appl. Surf. Sci.*, vol. 162–163 (2000), pp. 479–491.

Min, et al., "Atomic layer deposition of TiN thin films by sequential introduction of Ti precursor and NH/sub3/", *Symp.: Advanced Interconnects and Contact Materials and Processes for Future Integrated Circuits* (Apr. 13–16, 1998), pp. 337–342.

Klaus, et al., "Atomic Layer Deposition of Tungsten using Sequential Surface Chemistry with a Sacrificial Stripping Reaction, " Thin Solid Films 360 (2000), pp. 145–153, (Accepted Nov. 16, 1999).

Min, et al., "Metal–Organic Atomic–Layer Deposition of Titanium–Silicon–Nitride Films", *Applied Physics Letters,* American Inst. Of Physics, vol. 75(11) (Sep. 13, 1999).

Martensson, et al., "Atomic Layer Epitaxy of Copper on Tantalum", *Chemical Vapor Deposition,* 3(1) (Feb. 1, 1997), pp. 45–50.

Ritala, et al. "Atomic Layer Epitaxy Growth of TiN Thin Films", *J. Electrochem. Soc.,* 142(8) (Aug. 1995), pp. 2731–2737.

Elers, et al., "NbC15 as a precursor in atomic layer epitaxy", *Appl. Surf. Sci.,* vol. 82/83 (1994), pp. 468–474.

Lee, "The Preparation of Titanium–Based Thin Film by CVD Using Titanium Chlorides as Precursors", *Chemical Vapor Deposition,* 5(2) (Mar. 1999), pp. 69–73.

Martensson, et al., "Atomic Layer Epitaxy of Copper, Growth & Selectivity in the Cu (II)–2,2.6,6–Tetramethyl–3, 5–Heptanedion ATE/H2 Process", *J. Electrochem. Soc.,* 145(8) (Aug. 1998), pp. 2926–2931.

Min, et al., "Chemical Vapor Deposition of Ti–Si–N Films with Alternating Source Supply", *Mat. Res. Soc. Symp. Proc.,* vol. 564 (Apr. 5, 1999), pp. 207–210.

Bedair, "Atomic layer epitaxy deposition processes",*J. Vac. Sci. Technol.* 12(1) (Jan./Feb. 1994).

Yamaga, et al., "Atomic layer epitaxy of ZnS by a new gas supplying system in a low–pressure metalorganic vapor phase epitaxy", *J. of Crystal Growth* 117 (1992), pp. 152–155.

Elam, et al., "Nucleation and growth during tungsten atomic layer deposition on SiO2 surfaces," Thin Solid Films 386 (2001) pp. 41–52, (Accepted Dec. 14, 2000).

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al., "Low–temperature deposition of titanium nitride films from dialkylhydrazine–based precursors", Materials Science in Semiconductor Processing 2 (1999), pp. 149–157.

Suzuki, et al., "A 0.2–$\mu$m contact filing by 450° C–hydrazine–reduced TiN film with low resistivity", IEDM 92–979, pp. 11.8.1–11.8.3.

Suzuki, et al., "LPCVD–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some $\beta$–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Dedposition/ Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts of articles—atomic layer deposition.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10). (Oct. 1991), pp. 3062–3067.

"Applications of Integrated processing", Solid State Technology, US, Cowan Pub., vol. 37, No. 12 (Dec. 1, 1994), pp. 45–47.

Choi, C.S. et al., The Effect of Annealing on Resistiviy of Low Pressure Chemical Vapor Deposited Titanium Diboride. *J. Appl. Phys.* 69(11), Jun. 1, 1991. pp. 7853–7861, United States of America.

Choi, C. S. et al., Stability of TiB2 as a Diffusion Barrier on Silicon. *J. Electrochem. Soc.* vol. 138, No. 10, Oct. 1991, pp. 3062–3067, United States of America.

\* cited by examiner

LID ASSEMBLY FOR A PROCESSING SYSTEM TO FACILITATE SEQUENTIAL DEPOSITION TECHNIQUES

BACKGROUND OF THE INVENTION

1. Field of the Invention

This invention relates to semiconductor processing. More particularly, this invention relates to a processing system and method of distributing fluid therein to facilitate sequential deposition of films on a substrate.

2. Description of the Related Art

The semiconductor processing industry continues to strive for larger production yields while increasing the uniformity of layers deposited on substrates having increasingly larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer. Chemical Vapor Deposition (CVD) is a common deposition processes employed for depositing layers on a substrate. CVD is a flux-dependent deposition technique that requires precise control of the substrate temperature and precursors introduced into the processing chamber in order to produce a desired layer of uniform thickness. These requirements become more critical as substrate size increases, creating a need for more complexity in chamber design and fluid flow technique to maintain adequate uniformity.

A variant of CVD that demonstrates superior step coverage is a sequential deposition technique known as Atomic Layer Deposition (ALD). ALD has steps of chemisorption that deposit monolayers of reactive precursor molecules on a substrate surface. To that end, a pulse of a first reactive precursor is introduced into a processing chamber to deposit a first monolayer of molecules on a substrate disposed in the processing chamber. A pulse of a second reactive precursor is introduced into the processing chamber to form an additional monolayer of molecules adjacent to the first monolayer of molecules. In this manner, a layer is formed on a substrate by alternatingly pulsing an appropriate reactive precursor into a deposition chamber. Each injection of a reactive precursor is separated by an inert fluid purge to provide a new atomic layer additive to previous deposited layers to form a uniform layer on the substrate. The cycle is repeated to form the layer to a desired thickness. A drawback with ALD techniques is that the deposition rate is much lower than typical CVD techniques.

A need exists, therefore, to reduce the time required to deposit films employing sequential deposition techniques.

SUMMARY OF THE INVENTION

Provided is a lid for a semiconductor system, an exemplary embodiment of which includes a support having opposed first and second opposed surfaces, with valve coupled to the first surface. A baffle plate is mounted to the second surface. The valve is coupled to the support to direct a flow of fluid along a path in an original direction and at an injection velocity. The baffle plate is disposed in the path to disperse the flow of fluid in a plane extending transversely to the original direction.

DETAILED DESCRIPTION OF THE INVENTION

Figure 1:
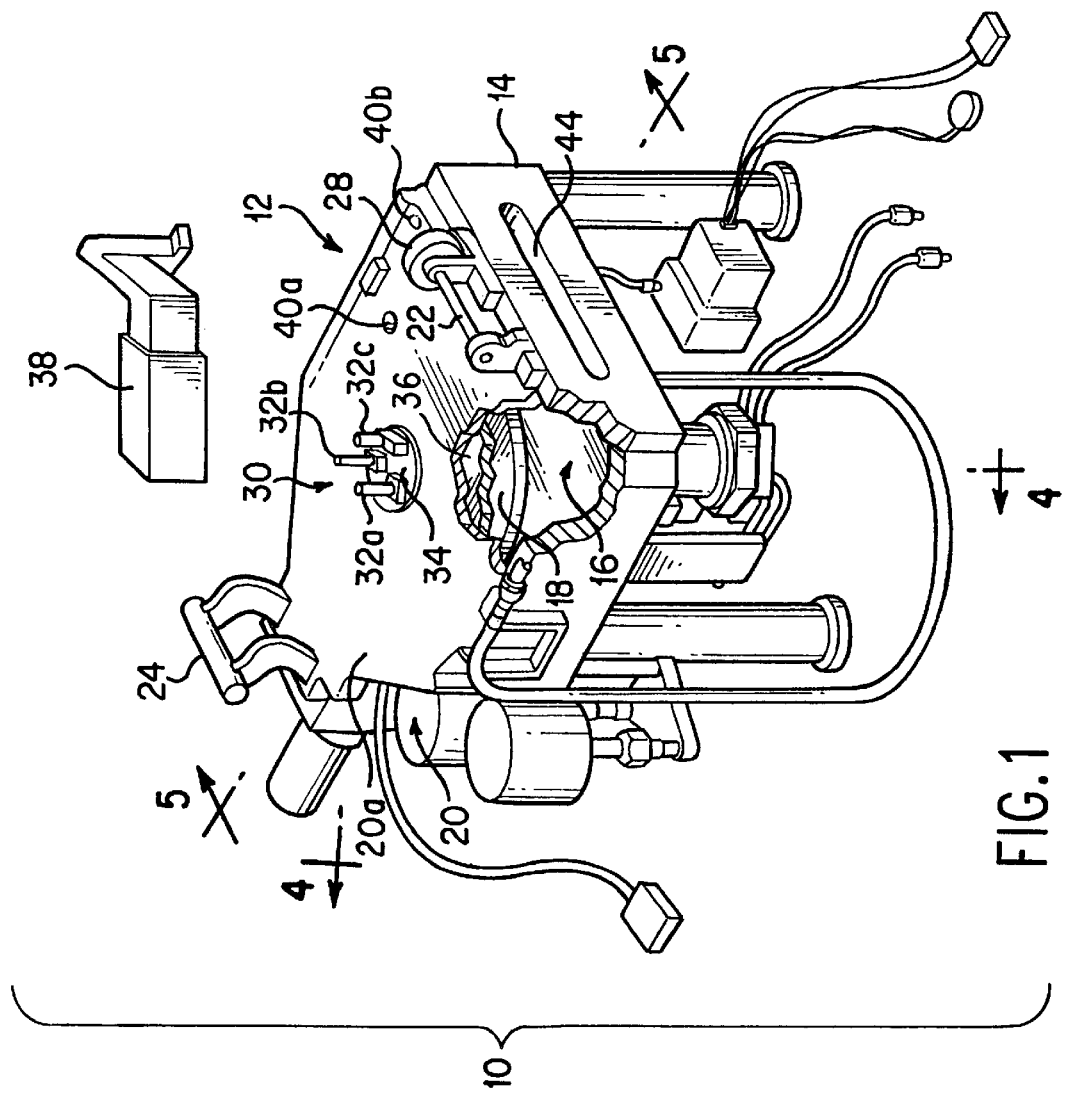
FIG. 1 is a simplified plan view of a plasma-based semiconductor processing system in accordance with one embodiment of the present invention.

Referring to FIG. 1, a semiconductor processing system 10 in accordance with one embodiment of the present invention includes an enclosure assembly 12 formed from a process-compatible material, such as aluminum or anodized aluminum. Enclosure assembly 12 includes a housing 14, defining a processing chamber 16 with an opening 18, and a vacuum lid assembly 20. Vacuum lid assembly 20 is pivotally coupled to housing 14 via a hinge 22 to selectively cover opening 18. A handle 24 is attached to vacuum lid assembly 20, opposite to hinge 22. Handle 24 facilitates moving vacuum lid assembly 20 between opened and closed positions. In the opened position, opening 18 is exposed, allowing access to processing chamber 16. In the closed position, vacuum lid assembly 20 covers opening 18, forming a fluid-tight seal therewith. In this manner, a vacuum formed in chamber 16 maintains vacuum lid assembly 20 against housing 14. Hinge 22, however, includes a locking ratchet mechanism 28 to prevent vacuum lid assembly 20 from unintentionally moving into the closed position.

Vacuum lid assembly 20 includes a process fluid injection assembly 30 to deliver reactive and carrier fluids into processing chamber 16, discussed more fully below. To that end, fluid injection assembly 30 includes a plurality of high-flow-velocity valves, 32a, 32b and 32c, a W-seal manifold 34, a baffle plate 36 and a support 20a. Valves, 32a, 32b and 32c, W-seal manifold 34, and baffle plate 36 are mounted to support 20a, discussed more fully below.

Figure 2:
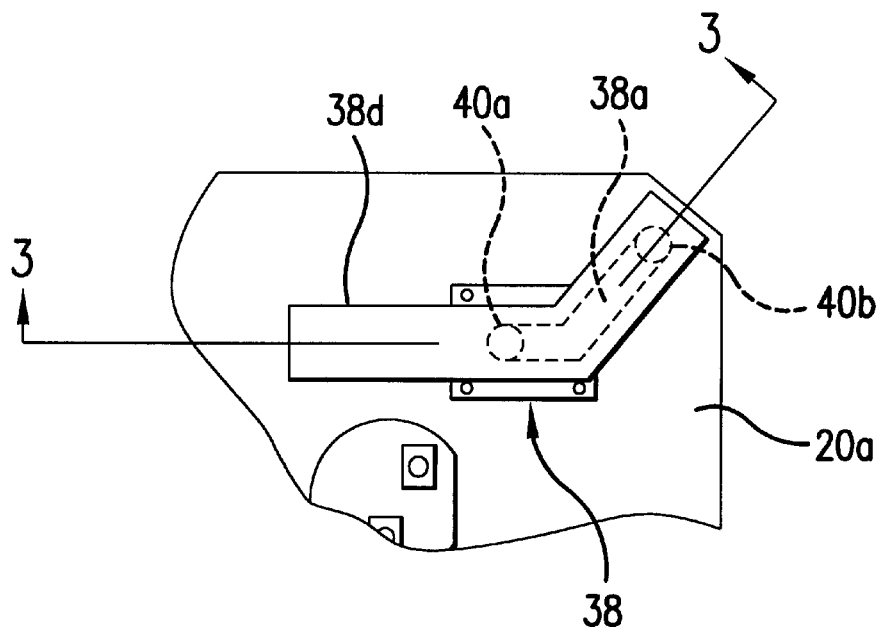
FIG. 2 is a partial top-down view of a remote plasma source mounted to a support shown above in FIG. 1.
Figure 3:
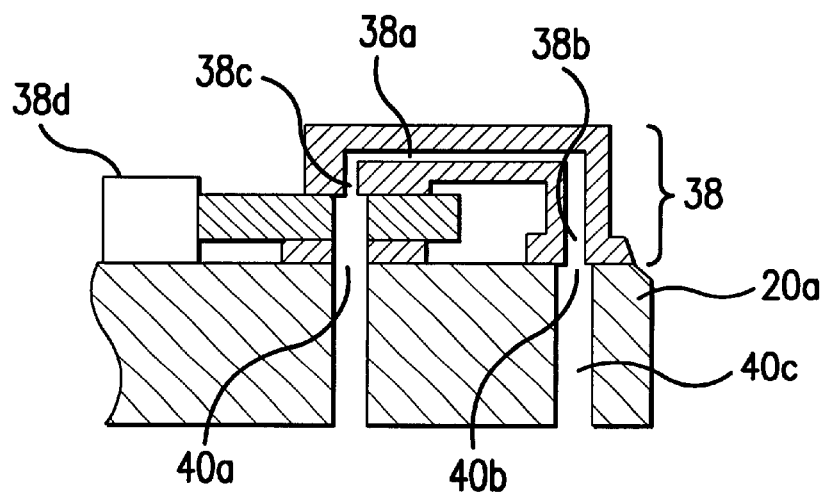
FIG. 3 is a cross-sectional view of the remote plasma source mounted to a support that is shown above in FIG. 2, taken along lines 3—3.

Referring to FIGS. 1, 2 and 3, attached to support 20a is a remote plasma source 38 that is placed in fluid communication with processing chamber 16 through radical input port 40a in support 20a. An intake port 40b, formed in support 20a, is in fluid communication with remote plasma source 38. Remote plasma source is a compact system that includes well-known subsystems. These subsystems include a microwave generator (not shown), in electrical communication with a plasma applicator (not shown), an autotuner (not shown), and an isolator (not shown). Wave-guides, shown for the sake of simplicity as 38a, are coupled between the aforementioned subsystems. An intake conduit 38b is in fluid communication with intake port 40b. An intake line (not shown) extends through housing 14 and is in fluid communication with intake port 40b to place a supply of etching fluids (not shown) in fluid communication with remote plasma source 38. An exit port 38c, which is in fluid communication with wave-guide 38a, is selectively placed in fluid communication with input port 40a via an isolation valve 38d.

To facilitate access to processing chamber 16, without compromising the fluid-tight seal between vacuum lid assembly 20 and housing 14, a slit valve opening 44 is present in housing 14, as well as a vacuum lock door (not shown). Slit valve opening 44 allows transfer of a wafer (not shown) between processing chamber 16 and the exterior of system 10. Any conventional wafer transfer assembly (not shown) may achieve the aforementioned transfer. An example of a conventional robotic wafer transfer assembly is described in commonly assigned U.S. Pat. No. 4,951,601 to Maydan, the complete disclosure of which is incorporated herein by reference.

Figure 4:
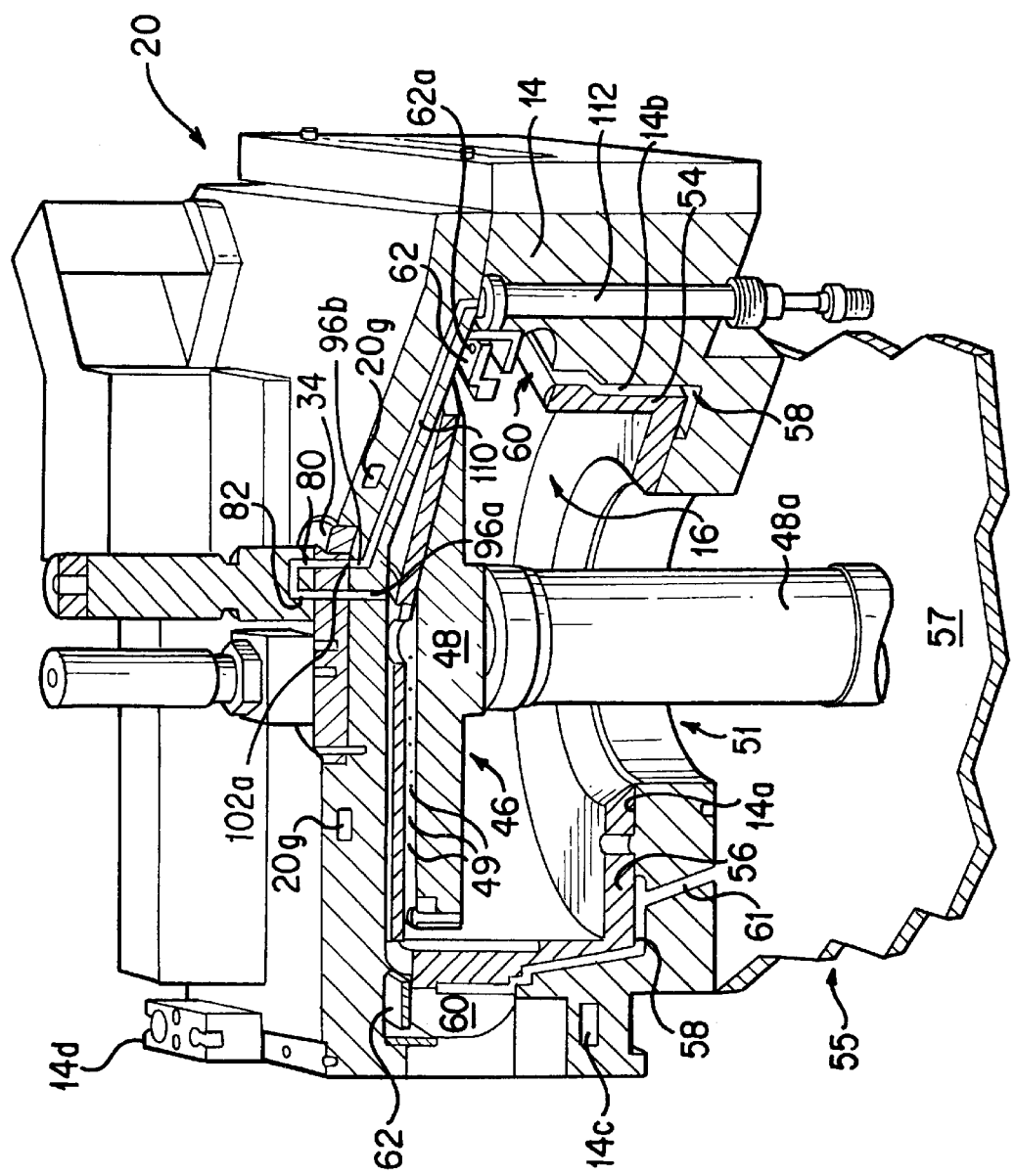
FIG. 4 is a detailed cut-away perspective view of a processing chamber shown above in FIG. 1, taken along lines 4—4.
Figure 5:
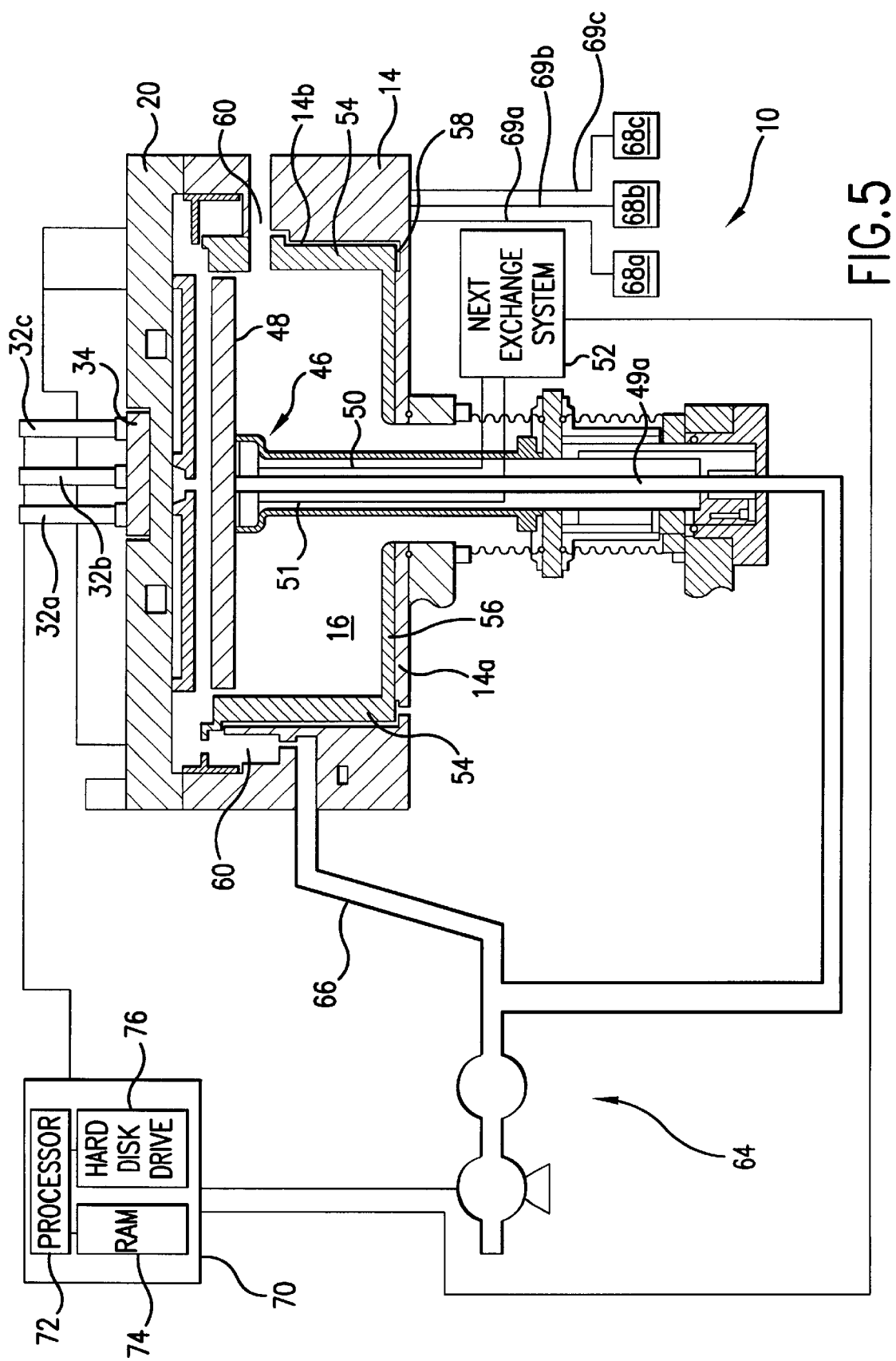
FIG. 5 is a detailed cross-sectional view of a processing chamber, shown above in FIG. 1 taken along lines 5—5 connected to various subsystems associated with system.

Referring to FIGS. 4 and 5, disposed within processing chamber 16 is a heater/lift assembly 46 that includes a wafer support pedestal 48 connected to a support shaft 48a. Support pedestal 48 is positioned between shaft 48a and vacuum lid assembly 20, when vacuum lid assembly 20 is in the closed position. Support shaft 48a extends from wafer support pedestal 48 away from vacuum lid assembly 20 through an orifice 51 formed in housing 14. Heater lift assembly 46 is adapted to be controllably moved so as to vary the distance between support pedestal 48 and vacuum lid assembly 20. A sensor (not shown) provides information concerning the position of support pedestal 48 within processing chamber 16. An example of a lifting mechanism for support pedestal 48 is described in detail in U.S. Pat. No. 5,951,776 to Selyutin et al., entitled "Self-Aligning Lift Mechanism", which is assigned to the assignee of the present invention and incorporated by reference herein.

Support pedestal 48 may be maintained within a desired process temperature range employing an embedded thermocouple 50 to monitor the temperature thereof in a conventional manner. For example, the measured temperature may be used in a feedback loop to control the electrical current applied to heater element 51 by a heat exchange system 52. Optionally, support pedestal 48 may be heated using radiant heat (not shown). Support pedestal 48 may be formed from any process-compatible material, including aluminum nitride and aluminum oxide ($Al_2O_3$ or alumina) and may also be configured to hold a substrate thereon employing a vacuum, i.e. support pedestal 48 may be a vacuum chuck. To that end, support pedestal 48 may include a plurality of vacuum holes 49 that are placed in fluid communication with a vacuum source, such as pump system 64 via vacuum tube 49a.

A liner assembly is disposed in processing chamber 16 and includes a cylindrical portion 54 and a planar portion 56. Cylindrical portion 54 and a planar portion 56 may be formed from any suitable material such as aluminum, ceramic and the like. Cylindrical portion 54 surrounds support pedestal 48. Planar portion 56 extends transversely to cylindrical portion 54 and is disposed against a surface 14a of processing chamber 16 disposed opposite to lid assembly 20. Liner assembly defines a chamber purge channel 58 between surface housing 14 and both cylindrical portion 54 and planar portion 56. Specifically, a first portion of purge channel 58 is defined between surface 14a and planar portion 56. A second portion of purge channel 58 is defined between surface 14b and cylindrical portion 54, with surface 14b extending extends transversely to surface 14a. The second portion of chamber purge channel 58 places the first portion in fluid communication with a pump channel 60 that extends circumferentially about cylindrical portion 54 of liner assembly. Attached to a portion of housing 14 disposed opposite to lid assembly 20 is a bellows 55 forming a fluid-tight void 57, as is well known in the semiconductor processing art. Typically, void 57 is filled with an inert, or purge fluid, such as argon. Purge channel is placed in fluid communication with void 57 and, therefore, the purge fluid therein, via a through-bore 61. Through-bore 61 extends through a portion of housing 14, disposed opposite to vacuum lid assembly 20. In this manner, purge fluid in void 57 may flow through purge channel 58 to reduce, if not, prevent accumulation of residue on surfaces 14a and 14b. Accumulation of residue on support pedestal 48 and on planar portion 56 is reduced, if not prevented, by purge fluid flowing into processing chamber 16 through orifice 51.

Disposed between pump channel 60 and lid assembly 20 is a pump plate 62 that includes a plurality of apertures, one of which is shown as 62a. Pump plate 62 controls the amount of flow between processing chamber 16 and pump channel 60. The size and number and position of apertures are established to achieve uniform flow over support pedestal 48. The flow within processing chamber 16 is provided by a pump system 64. Pump system 64 is in fluid communication with processing chamber 16 via an outlet line 66 and pump channel 60. A plurality of supplies of process fluids, 68a, 68b and 68c are in fluid communication with one of valves 32a, 32b or 32c through a sequence of conduits formed in housing 14, lid assembly 20, and W-seal manifold 34, as discussed more fully below. A controller 70 regulates the operations of the various components of system 10. To that end, controller 70 includes a processor 72 in data communication with memory, such as random access memory 74 and a hard disk drive 76 and is in signal communication with pump system 64, heat exchange system 52, and valves 32a, 32b and 32c.

Figure 6:
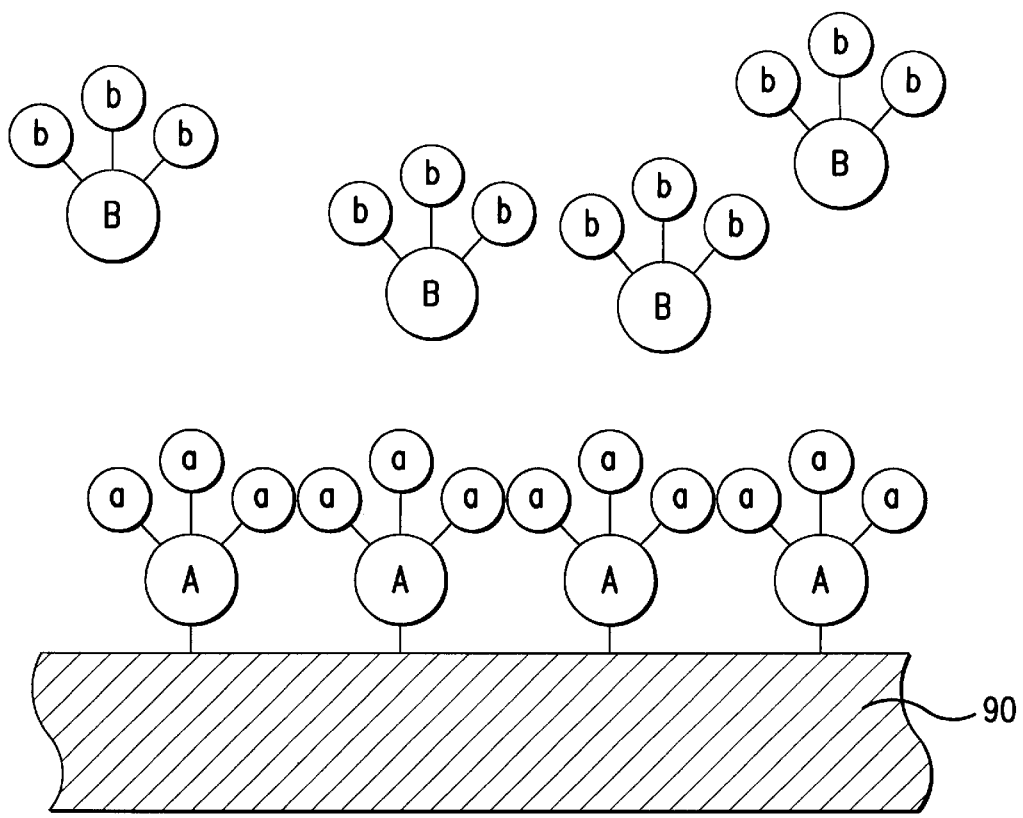
FIG. 6 is a schematic view showing deposition of a first molecule onto a substrate during sequential deposition.
Figure 7:
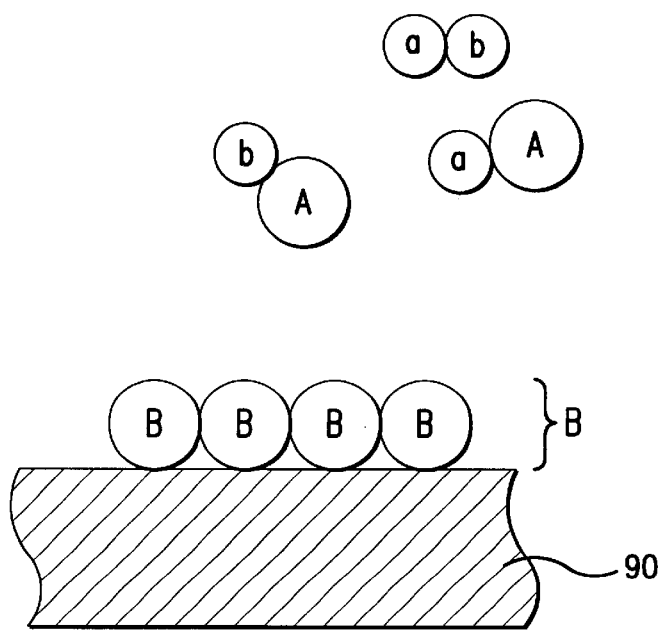
FIG. 7 is a schematic view showing deposition of second molecule onto a substrate during sequential deposition to form a film layer.

Referring to FIGS. 1, 6, and 7, during operation, system 10 deposits electrically conductive or electrically insulative layers employing sequential deposition techniques, e.g., atomic layer deposition and atomic layer nucleation. Depending on the specific stage of processing, the layers may be deposited on the material from which a substrate 90 is fabricated, e.g., $SiO_2$. Alternatively, the layer may be deposited on a layer previously formed on substrate 90, e.g., titanium, titanium nitride and the like. Assuming that a layer is formed on substrate 90, the initial surface presents an active ligand to the process region. A batch of a first processing fluid, in this case $Aa_x$, where x is an integer, results in a layer of A being deposited on substrate 90 having a surface of ligand a exposed to processing chamber 16. Thereafter, a purge fluid enters processing chamber 16 to purge the fluid $Aa_x$ that remains therein. After purging $Aa_x$ from processing chamber 16, a second batch of processing fluid, $Bb_y$, is introduced, with y being an integer. The ligand present on substrate 90 reacts with the b ligand and B atom, releasing molecules ab, Aa and Ab, that move away from substrate 90 and are subsequently pumped from processing chamber 16. In this manner, a surface comprising a monolayer of B atoms remains upon substrate 90 and is exposed to processing chamber 16, shown in FIG. 7. The process proceeds cycle after cycle, until the desired thickness for layer B is achieved.

Figure 8:
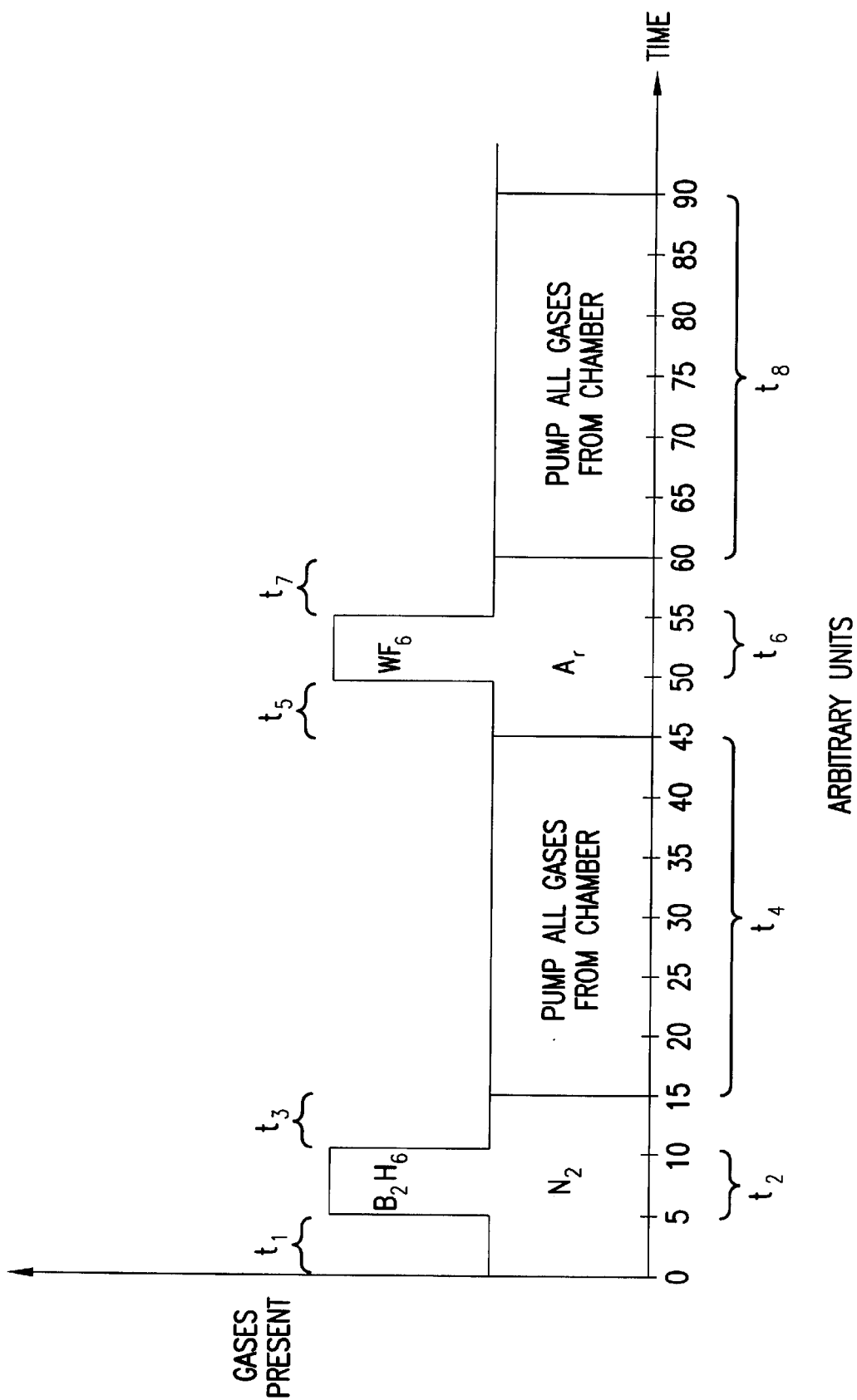
FIG. 8 is a graphical representation showing the concentration of gases introduced into the processing chamber shown above in FIGS. 1, 4–5, and the relative time in which the gases are present in the processing chamber.

Referring to both FIGS. 4, 6, and 8, although any type of process fluid may be employed, an example is discussed in which process fluid $Aa_x$ is $B_2H_6$ gas and processing fluid $Bb_y$ is $WF_6$ gas, and two purge fluids are employed: Ar gas and $N_2$ gas. The chamber pressure is in the range of 1–5 Torr, and pedestal 48 is heated in the range of 350° to 400° C. Each of the process fluids is flowed into processing chamber 16 with a carrier fluid, which in this example were one of the purge fluids: $WF_6$ is introduced with Ar and $B_2H_6$ is introduced with $N_2$. It should be understood, however, that the purge fluid might differ from the carrier fluid, discussed more fully below.

One cycle of the sequential deposition technique in accordance with the present invention includes flowing the purge fluid, $N_2$, into processing chamber 16 during time $t_1$, before $B_2H_6$ is flowed into processing chamber 16. During time $t_2$, the process fluid $B_2H_6$ is flowed into processing chamber 16 along with a carrier fluid, which in this example is $N_2$. After the flow of $B_2H_6$ terminates, the flow of $N_2$ continues during time $t_3$, purging processing chamber 16 of $B_2H_6$. During time $t_4$, processing chamber 16 is pumped so as to remove all process fluids. After pumping of processing chamber 16, the carrier fluid Ar is introduced during time $t_5$, after which time the process fluid $WF_6$ is introduced into processing chamber 16, along with the carrier fluid Ar during time $t_6$. After the flow of $WF_6$ into processing chamber 16 terminates, the flow of Ar continues during time $t_7$. Thereafter, processing chamber 16 is pumped so as to remove all process fluids therein, during time $t_8$, thereby concluding one cycle of the sequential deposition technique in accordance with the present invention. This sequence of cycles is repeated until the layer being formed thereby has desired characteristics, such as thickness, conductivity and the like. It can be seen that the time required during each period $t_1$–$t_8$ greatly affects the throughput of system 10. To maximize the throughput, the lid assembly 20 and injection assembly 30 are configured to minimize the time required to inject process fluids into processing chamber 16 and disperse the fluids over the process region proximate to support pedestal 48.

Figure 9:
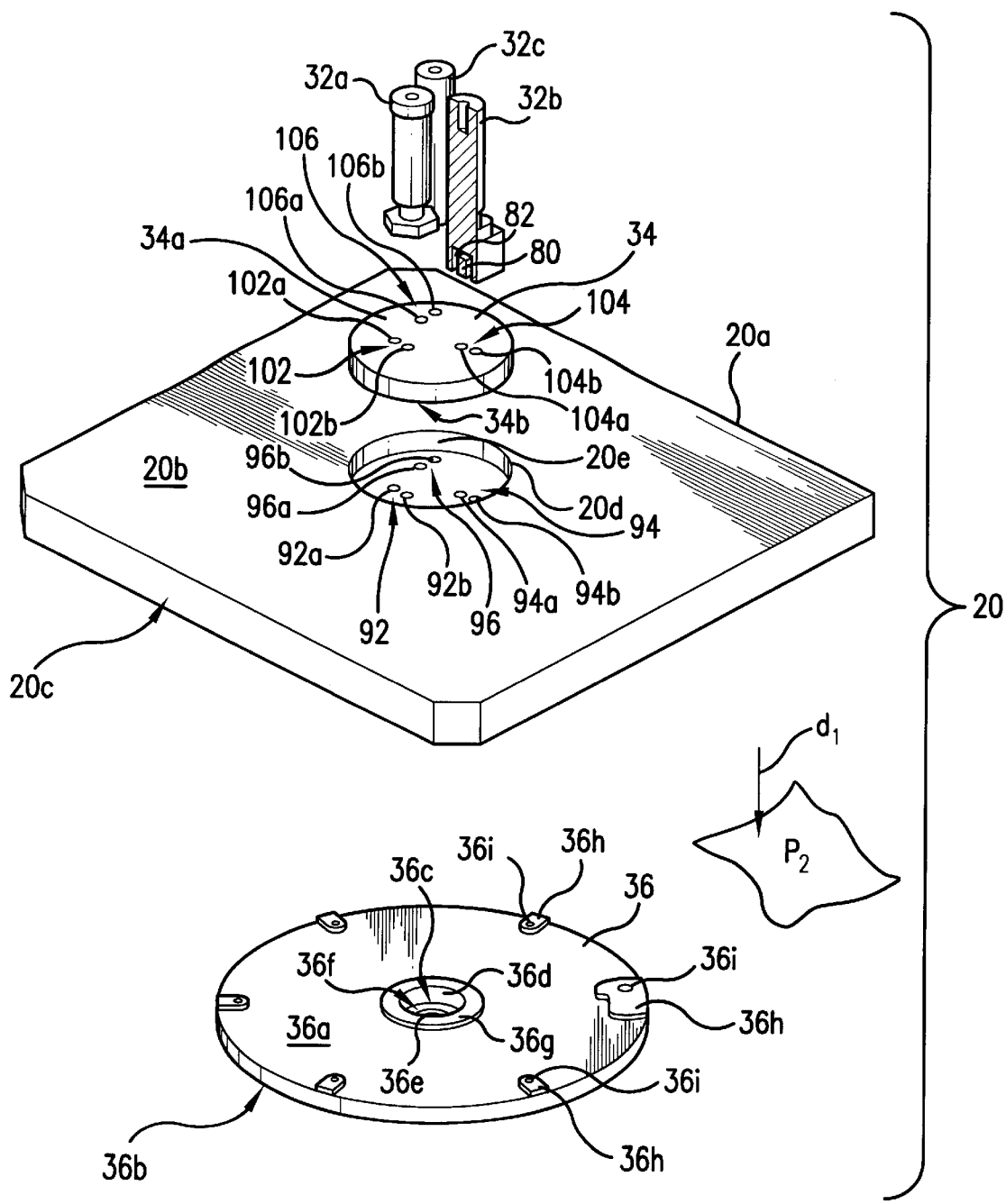
FIG. 9 is an exploded perspective view of a lid assembly discussed above with respect to FIGS. 1–5.

Referring to FIG. 9, as discussed above, lid assembly 20 includes a support 20a, high-flow-velocity valves, 32a, 32b and 32c, W-seal manifold 34, and baffle plate 36. Valves 32a, 32b and 32c are surface mount electronically controlled valves that are available from Fujikin of Japan as part number FR-21-6.35 UGF-APD. Each of valves 32a, 32b and 32c include an input port 80 and an output port 82. Support 20a includes first and second opposed surfaces 20b and 20c, with a recessed region 20d disposed in first surface 20b. Recessed region 20d includes a sidewall 20e that extends from first surface 20b toward second surface 20c, terminating in a recessed surface 20f. Each of a plurality of pairs of fluid transfer holes 92, 94 and 96 includes a borehole, 92a, 94a and 96a that extends between recessed surface 20f and second surface 20c. Also included with each pair of fluid transfer holes 92, 94 and 96 is an inlet passage 92b, 94b and 96b.

W-seal manifold 34 is formed from a more durable material than assembly 12. For example, W-seal manifold 34 may be fabricated from stainless steel and includes a plurality of pairs of fluid transfer channels 102, 104 and 106 extending between opposed surfaces 34a and 34b. Each of the pairs of fluid transfer channels 102, 104 and 106 includes an injection channel, shown as 102a, 104a and 106a, respectively. Also included with each of the pairs of fluid transfer channels 102, 104 and 106 is a reception channel, shown as 102b, 104b and 106b, respectively.

Baffle plate 36 includes first and second opposed sides 36a and 36b. First side 36a has a recessed area 36c. Recessed area 36c includes a sidewall 36d that extends from first side 36a toward second side 36c, terminating in a nadir region that includes a throughway 36e extending between the nadir region and second surface 36b, defining an annular nadir surface 36f. An annular protrusion 36g extends from first side 36a and surrounds recessed area 36c. Spaced-apart from annular protrusion 36g are a plurality of bulwarks 36h that also extend from first side 36a. Each of the plurality of bulwarks includes a through-bore 36i adapted to receive a fastener (not shown) to couple baffle plate 36 to support 20a. Similarly, W-seal manifold 34 is coupled to support 20a via fasteners (not shown) extending through bores (not shown), and valves 32a, 32b and 32c are fastened to W-seal manifold 34 in a similar manner.

Upon being attached to support 20a, W-seal manifold 34 is disposed within recessed region 20d with surface 34b resting against recessed surface 20f forming a fluid-tight seal therewith. Fluid transfer channels 102, 104 and 106 on W-seal manifold 34 are arranged to superimpose fluid transfer holes 92, 94 and 96 and have a cross-sectional area that is coextensive therewith. In this manner, transfer channels 102, 104 and 106 are coaxial with fluid transfer holes 92, 94 and 96. Output port 82 of each of valves 32a, 32b and 32c superimposes one of injection channels 102a, 104a and 106a and, therefore, one of boreholes, 92a, 94a and 96a. Output port 82 has a cross-sectional area that is coextensive with the cross-sectional area of valve 32a, 32b and 32c it superimposes. Input port 80 of each of valves 32a, 32b and 32c superimposes one of reception channels 102a, 104a and 106a and, therefore, one of an inlet passage 92b, 94b and 96b. Input port 80 has a cross-sectional area that is coextensive with the cross-sectional area of valves 32a, 32b and 32c it superimposes. Each of injection channels 92a, 94a and 96a superimposes with annular nadir surface 36f.

Referring to FIGS. 4, 5, and 9, each of inlet passages 92b, 94b and 96b is in fluid communication with supplies of process fluids 68a, 68b and 68c via a fluid transfer channel that extends through support 20a, and a fluid feed-through that extends through housing 14. As shown, inlet passage 96b is in fluid communication with fluid transfer channel 110. Fluid transfer channel 110 is connected to fluid feed-through 112. Although not shown, fluid feed-through 112 is in fluid communication with one of supplies 68a, 68b and 68c through one of supply lines 69a, 69b and 69c, respectively. In this fashion, fluid transfer channel 110, and fluid feed-through 112 define a fluid input path. It should be understood that each of inlet passages 92b, 94b and 96b are connected to an input path that differs from the input path connected to the remaining inlet passages 92b, 94b and 96b. In this manner, each of supplies of process fluids 68a, 68b and 68c is uniquely associated with one of valves 32a, 32b and 32c, through differing feed-throughs (not shown).

Figure 10:
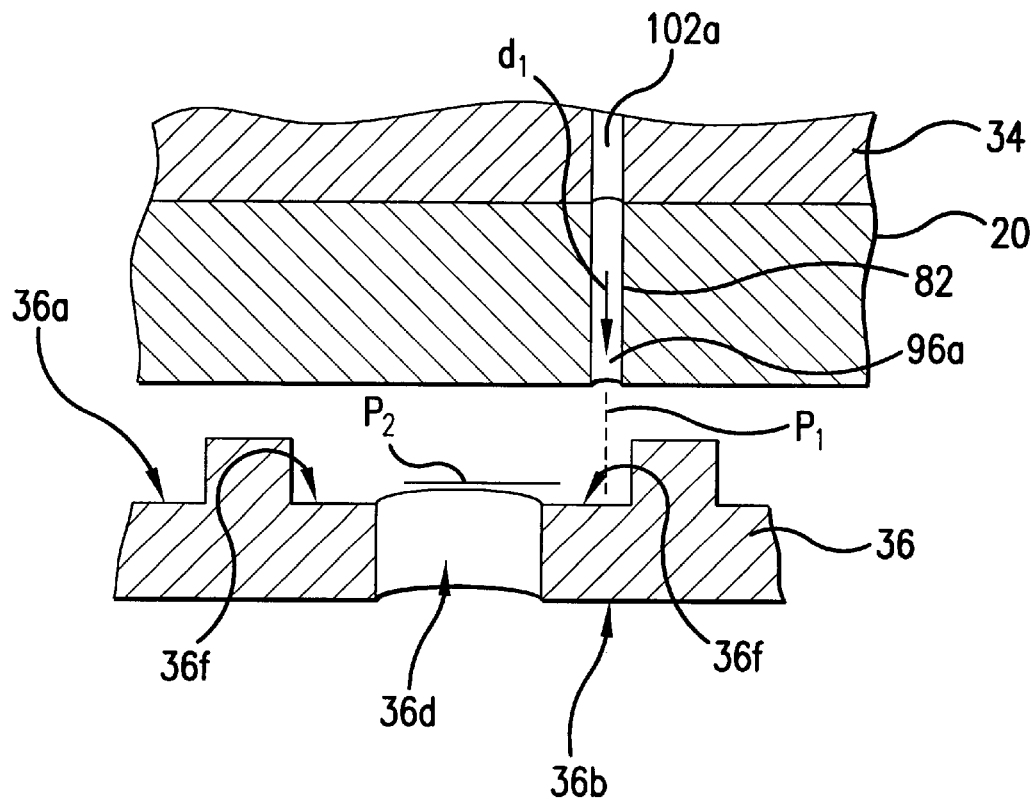
FIG. 10 is a detailed cross-section view of a portion of the lid assembly shown above in FIG. 9.

Referring to FIGS. 1, 9 and 10, a flow of process fluids into processing chamber 16 is discussed below with respect to valve 32c for ease of discussion and should be understood to apply to the two remaining valves 32a and 32b. Lid assembly 20 is configured to minimize the time required to inject process fluids into processing chamber 16. To that end, valve 32c selectively allows fluid to flow between input port 80 and output port 82. The pressure of fluid in input port 80, before activation of valve 32c may be as high as 200 Torr, referred to as an up-stream pressure. After activation of valve 32c, fluid is transferred to output port 82 at a pressure of 200 Torr and drops rapidly, in a fraction of a second, to a pressure of as low as 2 Torr, referred to as a down-stream pressure. The difference in up-stream and down-stream pressures results in process fluids travel over path $p_1$ along a first direction $d_1$ and exiting borehole 96a at a great velocity, up to 300 meters/second. Annular nadir surface 36f reduces the velocity of the process fluids traveling through processing chamber 16, before the process fluids reach support pedestal 48. Specifically, process fluids impact with annular nadir surface 36f, and annular nadir surface 36f disperses these process fluids to travel in a plane $p_2$ that extends transversely to direction $d_1$. In this manner, the direction that the of process fluids travel is changed and the velocity of the same reduced before reaching support pedestal 48. Changing the velocity and direction of process fluids exiting borehole 96a overcomes a problem identified with implementation of valves 32a, 32b and 32c. It was found that process fluids exiting borehole 96a and passing directly through throughway 36e to impinge upon a substrate (not shown) caused a film formed on there to have non-uniform thickness. Specifically, the area of a film that is superimposed by the borehole 96a would be thinner than the remaining areas of a film. This is believed to be, in part, to a thermal gradient that is created on the substrate (not shown). The thermal gradient is believed to result in the high velocity flow of process fluids impacting upon localized regions (not shown) of the substrate (note shown). These regions (not shown) have a lower temperature than the remaining regions (not shown) of the substrate (not shown), resulting in a lower deposition in these regions (not shown). To avoid the aforementioned temperature gradient, and the aforementioned thinning effect, the process fluids are dispersed and slowed by annular nadir surface 36f. Thereafter, a pressure differential present between sides 36a and 36b causes the dispersed fluid to flow toward a common region of baffle plate 36, such as recessed region 36c. Thereafter, the process fluids once again travel along direction $d_1$ through throughway 36e and along path $p_3$.

After exiting throughway 36e, the process fluids flow away from throughway 36e and travel substantially parallel while the same impinges upon the entire area of a substrate (not shown) mounted atop of support pedestal 48. To that end, throughway 36e is radially and symmetrically disposed about an axis that is centered with respect to support pedestal 48, and the area of baffle plate 36 is substantially coextensive with the area of support pedestal 48.

Providing recessed region 20d facilitates high-speed deposition of process fluids by shortening the distance between output port 82 and baffle plate 36. Mounting of valves 32a, 32b and 32c is achieved by bolting the same to lid assembly 20. Although one embodiment of the present invention includes directly mounting valves 32a, 32b and 32c to support 20a, this configuration was found to be undesirable. Support 20a is manufactured from aluminum or other lightweight material that is unsuitable for affixing valves 32a, 32b and 32c thereto. As a result, W-seal manifold 34 is provided. W-seal manifold is manufactured from a more durable material, such as stainless steel. It was recognized that the introduction of W-seal manifold 34 increased the distance between output port 80 and baffle plate 36 by a magnitude equal, at least, to a length of injection channels 102a, 104a and 106a. Recessed region 20d is formed in support 20a to compensate for the increased distance. Specifically, W-seal manifold 34 fits within recessed region 20d, which reduces the aforementioned increase in distance between output port 80 and baffle plate 36 that results from the introduction of W-seal manifold 34.

Figure 11:
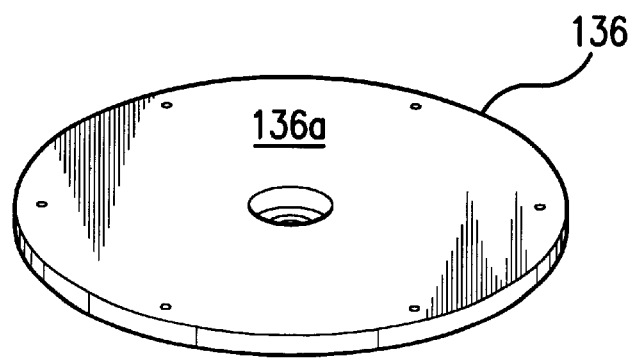
FIG. 11 is a perspective view of an alternate embodiment of a baffle plate shown above in FIG. 10.

Referring to FIGS. 4, 9, and 11, another embodiment of baffle plate 36 is shown as baffle plate 136. Baffle plate 136 is identical to baffle plate 36, excepting for the omission of annular protrusion 36g and bulwarks 36h. More specifically, surface 136a is substantially planar so that the entire area thereof rests against support 20a when coupled thereto. Baffle plate 36, however, has attendant advantages by the presence of annular protrusion 36g and bulwarks 36h. With the configuration of baffle plate 36, only annular protrusion 36g and bulwarks 36h are in contact with support 20a when coupled thereto. The remaining regions of surface 36a are spaced-apart from support 20a, which facilitates removal of deposition residue from baffle plate 36 during a plasma clean process employing remote plasma source 38. This is due, it is believed, by limiting thermal conduction between baffle plate 36 and support 20a to annular protrusion 36g and bulwarks 36h. In this manner, the temperature of baffle plate 36 is maintained at a sufficiently high magnitude to remove most, if not all, residue therefrom by employing standard remote plasma clean techniques.

Further temperature control of system 10 may be achieved by coolant channels 20g in lid assembly 20 and a coolant channel 14c in housing 14, shown more clearly in FIG. 4. Coolant channels 20g and 14c are in fluid communication with a coolant manifold 14d, which is connected to a supply (not shown) of a suitable coolant.

Figure 12:
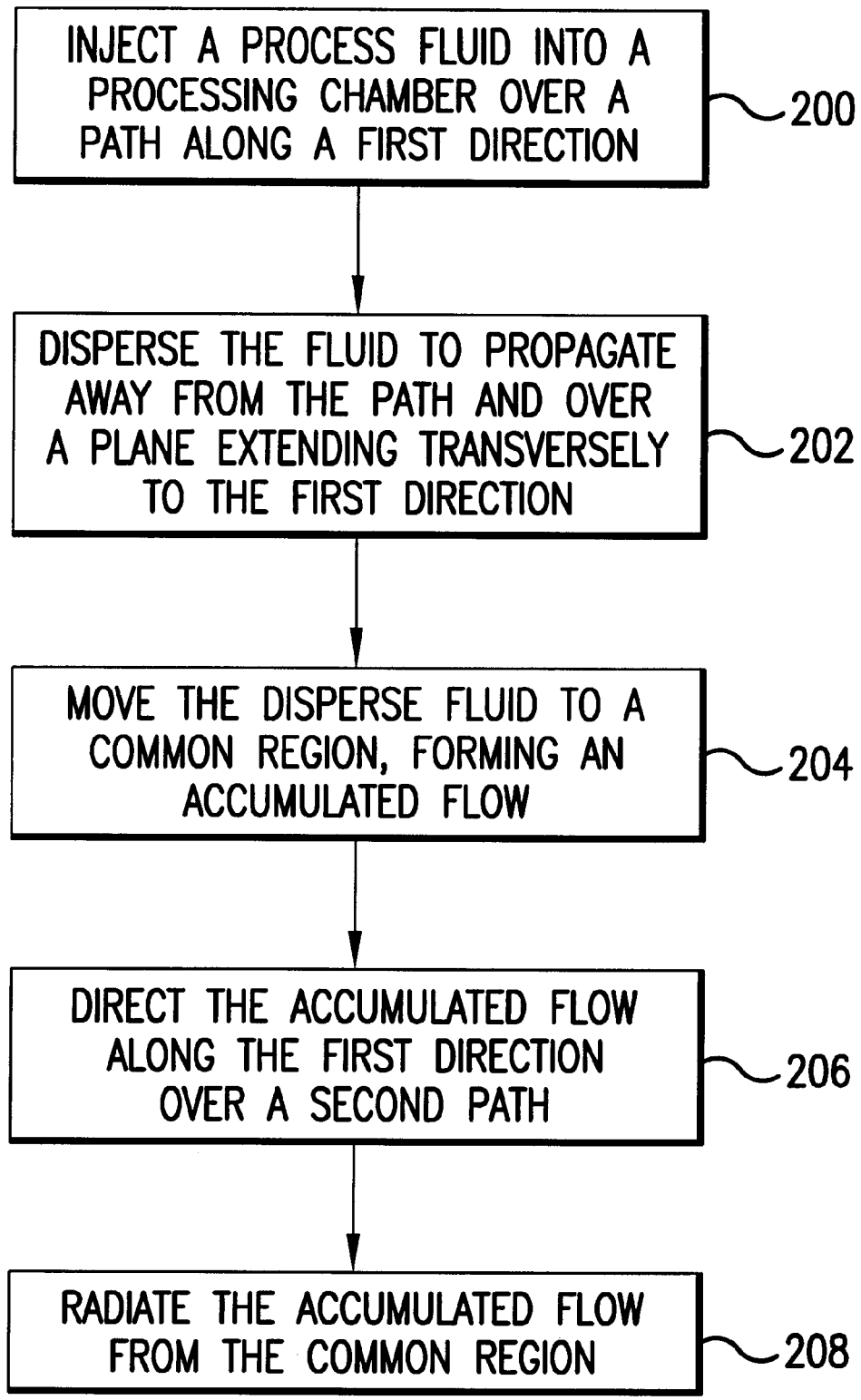
FIG. 12 is a flow diagram showing a method to flow process fluids into the process chamber in accordance with an embodiment of the present invention.

Referring to FIGS. 5, 10 and 12, an exemplary method of introducing processing fluids into semiconductor processing chamber 16 includes injecting a process fluid into said processing chamber 16 over a path $p_1$ in a first direction $d_1$ toward support pedestal 48, defining a flow of fluid at step 200. At step 202, a dispersed flow is formed from the flow of fluid by dispersing the same to propagate away from the path $p_1$ and over a plane $p_2$ that extends transversely to the first direction $d_1$. At step 204, the dispersed flow is moved toward a common region, such as throughway 36d, in processing chamber 16, disposed proximate to the path $p_1$ to form an accumulated flow of process fluid. At step 206, the accumulated flow is directed along a second path $p_3$, spaced-apart from the first path, along the first direction $d_1$. At step 208, the accumulated flow is radiated away from the common region at it travels toward support pedestal 48, shown by arrows 37.

Figure 13:
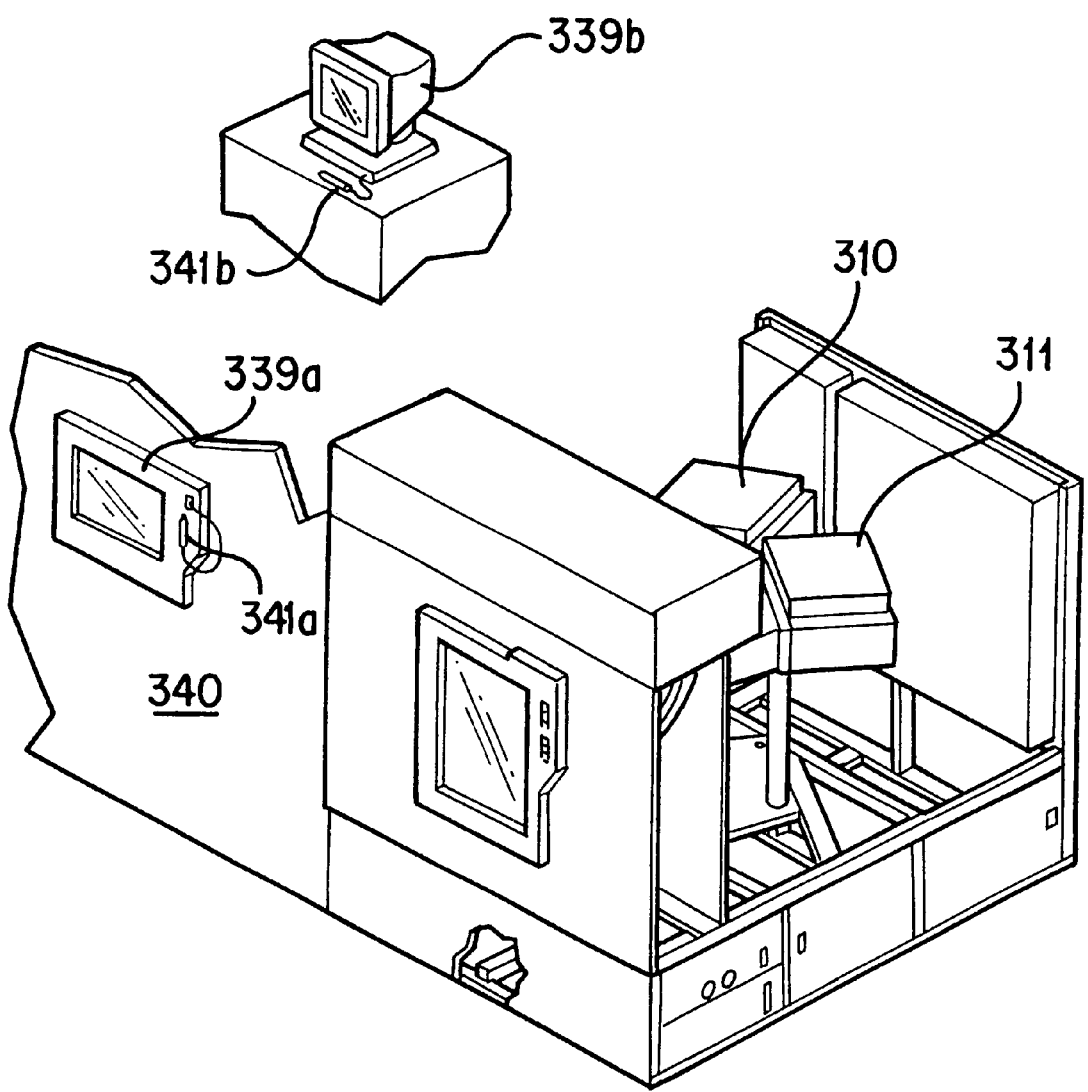
FIG. 13 is a perspective view of a processing environment in which the processing system, shown above in FIGS. 1, 4–5, may be employed.

Referring to FIGS. 5 and 13 an interface between a user and controller 70 may be via a visual display. To that end, one or more monitors 339a and 339b may be employed. One monitor 339a may be mounted in a clean room wall 340 having one or more systems 310 and 311. The remaining monitor 339b may be mounted behind wall 340 for service personnel. Monitors 339a and 339b may simultaneously display the same information. Communication with controller 70 may be achieved with a light pen associated with each of monitors 339a and 139b. For example, a light pen 341 a facilitates communication with controller 70 through monitor 339a, and a light pen 341b facilitates communication with controller 70 through monitor 339b. A light sensor in the tip of light pens 341a and 341b detects light emitted by CRT display in response to a user pointing the same to an area of the display screen. The touched area changes color, or a new menu or screen is displayed, confirming communication between the light pen and the display screen. Other devices, such as a keyboard, mouse, or other pointing or communication device may be used instead of or in addition to light pens 341a and 341b to allow the user to communicate with controller 70.

As discussed above, a computer program having sets of instructions controls the various subsystems of system 10. The computer program code may be written in any conventional computer readable programming language: for example, 68000 assembly language, C, C++, Pascal, Fortran and the like. Suitable program code is entered into a single file or multiple files using a conventional text editor and stored or embodied in a computer-readable medium, such as memory 74 of controller 70. If the entered code text is a high level language, the code is compiled. The resultant compiler code is then linked with an object code of precompiled Windows® library routines. To execute the linked and compiled object code the system user invokes the object code, causing controller 70 to load the code in memory 74 from, for example, hard disk drive 76. Controller 70 then reads and executes the code to perform the tasks identified in the program.

Figure 14:
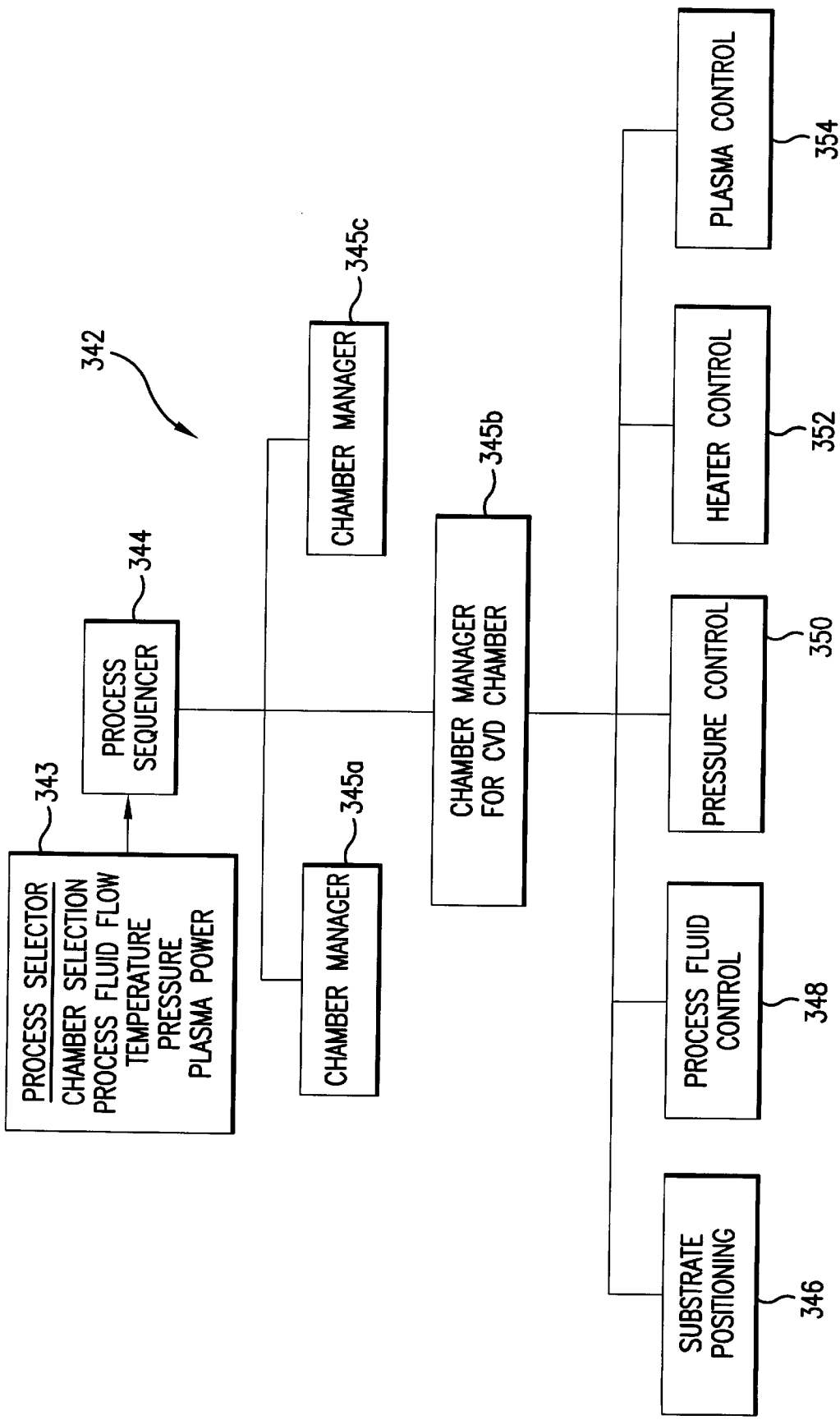
FIG. 14 is a block diagram showing the hierarchical control structure of system control software employed to control the processing system, discussed above with respect to FIGS. 1, 4–5 and 13.

Referring to both FIGS. 13 and 14 an illustrative block diagram of the hierarchical control structure of the system control software is shown including a computer program 342 that a user may access using a light pen interface. For example, a user may enter a process set number and system number into a process selector subroutine 343 in response to menus or screens displayed one or more of monitors 339a and 339b. Predefined set numbers identifies the process sets, which are predetermined sets of process parameters necessary to carry out specified processes. Process selector subroutine 343 identifies (i) the desired system 310 and 311, and (ii) the desired set of process parameters needed to operate systems 310 and 311 for performing the desired process. The process parameters for performing a specific process relate to process conditions such as process fluid composition and flow rates, pressure, plasma conditions such as high- and low-frequency RF power levels and the high and low RF frequencies (and in addition, microwave generator power levels for embodiments equipped with remote microwave plasma systems), and cooling fluid pressure. Process selector subroutine 343 controls what type of process (deposition, substrate cleaning, chamber cleaning, chamber gettering, reflowing) is performed at an appropriate time. In some embodiments, there may be more than one process selector subroutine.

A process sequencer subroutine 344 comprises program code for accepting the identified system 310 and 311 and set of process parameters from chamber selector subroutine 343, and for controlling operation of systems 310 and 311. Multiple users can enter process set numbers and system numbers, or a single user can enter multiple process set numbers and system numbers, so sequencer subroutine 344 operates to schedule the selected processes in the desired sequence. Preferably, sequencer subroutine 344 includes program code to perform the steps of (i) monitoring the operation of systems 310 and 311 to determine whether systems 310 and 311 are being used, (ii) determining what processes are being carried out in systems 310 and 311, and (iii) executing the desired process based on availability of a system and the type of process to be carried out. Conventional methods of monitoring systems 310 and 311 can be used, such as polling. When scheduling the process to be executed, sequencer subroutine 344 may be designed to take into consideration the present condition of the system 310 and 311 being used in comparison with the desired process conditions for a selected process, or the "age" of each particular user-entered request, or any other relevant factor a system programmer desires to include for determining scheduling priorities.

Once sequencer subroutine 344 determines which system 310 and 311 and process set combination will be executed next, sequencer subroutine 344 initiates execution of the process set by passing the particular process set parameters to a chamber manager subroutine 345a–c that controls multiple processing tasks according to the process set determined by sequencer subroutine 344. For example, chamber manager subroutine 345b comprises program code for controlling operations in systems 310 and 311. Chamber manager subroutine 345b also controls execution of various system component subroutines that controls operation of the system components necessary to carry out the selected process set. Examples of chamber component subroutines are substrate positioning subroutine 346, process fluid control subroutine 348, pressure control subroutine 350, heater control subroutine 352, and plasma control subroutine 354. Depending on the specific configuration of the system, some embodiments include all of the above subroutines, while other embodiments may include only some of the subroutines. Those having ordinary skill in the art would readily recognize that other system control subroutines can be included depending on what processes are to be performed in systems 310 and 311. In operation, chamber manager subroutine 345b selectively schedules or calls the system component subroutines in accordance with the particular process set being executed. Chamber manager subroutine 345b schedules the system component subroutines much like sequencer subroutine 344 schedules which of systems 310 and 311 and process set is to be executed next. Typically, chamber manager subroutine 345b includes steps of monitoring the various system components, determining which components need to be operated based on the process parameters for the process set to be executed, and initiating execution of a system component subroutine responsive to the monitoring and determining steps.

Referring to both FIGS. 5 and 14, substrate positioning subroutine 346 comprises program code for controlling system components that are used to load the substrate (not shown) onto support pedestal 48 and, optionally, to lift the substrate (not shown) to a desired height in processing chamber 16 to control the spacing between the substrate (not shown) and baffle plate 36. When a substrate is loaded into processing chamber 16, heater/lift assembly 46 is lowered to receive the substrate (not shown) on support pedestal 48, and then is placed to the desired position. In operation, substrate positioning subroutine 346 controls movement of heater/lift assembly 46 and support pedestal 48 in response to process set parameters related to the support height that are transferred from chamber manager subroutine 345b.

Process fluid control subroutine 348 has program code for controlling process fluid composition and flow rates. Process fluid control subroutine 348 controls the open/close position of the safety shut-off valves (not shown), and also ramps up/down the mass flow controllers (not shown) to obtain the desired fluid flow rate. Process fluid control subroutine 348 is invoked by chamber manager subroutine 345b, as are all system component subroutines, and receives subroutine process parameters related to the desired fluid flow rates from the chamber manager. Typically, process fluid control subroutine 348 operates by activating valves 32a, 32b and 32c to allow process fluids to traverse fluid supply lines 69a, 69b and 69c, without the need for either (i) reading mass flow controllers, (ii) comparing the readings to the desired flow rates or (iii) adjusting the flow rates of fluid supply lines 69a, 69b and 69c as necessary. However, process fluid control subroutine 348 includes steps for monitoring the fluid flow rates for unsafe rates, and activating the safety shut-off valves (not shown) when an unsafe condition is detected. Process fluid control subroutine 348 also controls the fluid composition and introduction of clean fluids as well as for deposition fluids, depending on the desired process (clean or deposition or other) that is selected. Alternative embodiments could have more than one process fluid control subroutine, each subroutine controlling a specific type of process or specific sets of fluid lines.

As discussed above, some processes have an inert fluid such as nitrogen, $N_2$, or argon, Ar, is flowed into processing chamber 16 to stabilize the pressure in processing chamber 16 before reactive process fluids are introduced. For these processes, process fluid control subroutine 348 is programmed to include steps for flowing the inert fluid into processing chamber 16 for an amount of time necessary to stabilize the pressure in processing chamber 16, and then the steps described above would be carried out. Additionally, when a process fluid is to be vaporized from a liquid precursor, process fluid control subroutine 348 would be written to include steps for bubbling a delivery fluid, such as helium, through the liquid precursor in a bubbler assembly (not shown), or for introducing a carrier fluid, such as helium, to a liquid injection system. When a bubbler is used for this type of process, process fluid control subroutine 348 regulates the flow of the delivery fluid, the pressure in the bubbler (not shown), and the bubbler temperature in order to obtain the desired process fluid flow rates. As discussed above, the desired process fluid flow rates are transferred to process fluid control subroutine 348 as process parameters. Furthermore, process fluid control subroutine 348 includes steps for obtaining the necessary delivery fluid flow rate, bubbler pressure, and bubbler temperature for the desired process fluid flow rate by accessing a stored table containing the necessary values for a given process fluid flow rate. Once the necessary values are obtained, the delivery fluid flow rate, bubbler pressure and bubbler temperature are monitored, compared to the necessary values and adjusted accordingly.

Pressure control subroutine 350 comprises program code for controlling the pressure in the processing chamber 16 by regulating, inter alia, the aperture size of the throttle valve that is included in pump system 64. The aperture size of the throttle valve is set to control the chamber pressure at a desired level in relation to the total process fluid flow, the size of processing chamber 16, and the pumping set-point pressure for pump system 64. When pressure control subroutine 350 is invoked, the desired or target pressure level is received as a parameter from chamber manager subroutine 345b. Pressure control subroutine 350 measures the pressure in processing chamber 16 by reading one or more conventional pressure manometers connected to processing chamber 16, comparing the measure value(s) to the target pressure, obtaining PID (proportional, integral, and differential) values corresponding to the target pressure from a stored pressure table, and adjusting the throttle valve according to the PID values obtained from the pressure table. Alternatively, pressure control subroutine 350 can be written to open or close the throttle valve (not shown) to a particular aperture size to regulate the pumping capacity in processing chamber 16 to the desired level.

Heater control subroutine 352 comprises program code to control operation of heat exchange system 52 and, therefore, the temperature of heater/lift assembly 46. Plasma control subroutine 354 comprises program code to control operation of remote plasma source 38. Like the previously described system component subroutines, plasma control subroutine 354 is invoked by chamber manager subroutine 345b.

Although the invention has been described in terms of specific embodiments, one skilled in the art will recognize that various modifications may be made that are within the scope of the present invention. For example, although three valves are shown, any number of valves may be provided, depending upon the number of differing process fluids employed to deposit a film. Therefore, the scope of the invention should not be based upon the foregoing description. Rather, the scope of the invention should be determined based upon the claims recited herein, including the full scope of equivalents thereof.

What is claimed is:

1. A lid assembly for a semiconductor processing system, comprising:
   a support having first and second opposed surfaces;
   a valve coupled to said first surface; and
   a baffle plate mounted to said second surface and having a throughway disposed in a recessed area of the baffle plate, with said valve coupled to said support to direct a flow of fluid through a borehole in the support along a path in an original direction and at an injection velocity and said baffle plate being disposed in said path to disperse said flow of fluid in a plane extending at least partially transversely to said original direction.

2. The assembly as recited in claim 1 wherein the bore hole extends between said first and second opposed surfaces and said baffle plate further includes first and second opposed sides, with said first side having the recessed area, wherein the recessed area extends from said first side and terminates in a nadir region having the throughway formed therein, wherein the throughway extends between said nadir region and said second surface, defining an annular nadir surface, with said borehole superimposing said annular nadir surface.

3. The assembly as recited in claim 1 wherein said baffle plate further includes first and second opposed sides, an annular protrusion and a plurality of bulwarks spaced apart from said annular protrusion, with said protrusion and said plurality of bulwarks extending from said first side and contacting said support, with the remaining regions of said first side being spaced-apart from the support.

4. The assembly as recited in claim 1 wherein said support further includes a recessed region disposed in said first surface, said recessed region including a sidewall extending from said first surface, toward said second surface and terminating in a recessed surface with a borehole extending between said recessed surface and said second surface, said baffle plate further including first and second opposed sides, with said first side having the recessed area, wherein the recessed area extends from said first side and terminates in a nadir region having the throughway formed therein, wherein the throughway extends between said nadir region and said second surface, defining an annular nadir surface, with said borehole superimposing said annular nadir surface.

5. The assembly as recited in claim 4 further including a W-seal manifold disposed within said recessed region, between said valve and said recessed surface, said manifold having an injection channel and a reception channel, with said injection channel being axially aligned and in fluid communication with both said output port and said borehole and having a cross-sectional area coextensive therewith, with said reception channel being in fluid communication with said input port.

6. The assembly as recited in claim 1 further including a W-seal manifold mounted between said valve and said support, said manifold having an injection channel and a reception channel, with said injection channel being axially aligned and in fluid communication with both said output port and said borehole and having a cross-sectional area coextensive therewith, with said reception channel being in fluid communication with said input port.

7. The assembly as recited in claim 1 wherein said through-way is disposed radially and symmetrically about an axis, with said support further including a radical through-port extending between said first and second opposed surfaces and spaced apart from said axis.

8. A lid assembly for a semiconductor processing system, comprising:

a support having first and second opposed surfaces with a borehole extending therebetween;

a valve coupled to said first surface and in fluid communication with said borehole; and a baffle plate mounted to said second surface, said baffle plate including first and second opposed sides, with a recessed area extending from said first side and terminating in a nadir region having a throughway formed therein extending between said nadir region and said second surface, defining an annular nadir surface, with said borehole superimposing said annular nadir surface.

9. The assembly as recited in claim 8 further including an additional valve, with said valve and said additional valve defining a plurality of valves, and wherein said support further includes an additional borehole, with said borehole and said additional borehole defining a plurality of boreholes, with each of said plurality of valves being in fluid communication with one of said plurality of boreholes.

10. The assembly as recited in claim 9 further including a W-seal manifold disposed between said plurality of valves and said support, wherein each of said plurality of valves includes an input port and an output port and said W-seal manifold includes a plurality of pairs of fluid transfer channels, with each pair of fluid transfer channels including an injection channel and a reception channel, with each injection channel of said plurality of pairs of fluid transfer channels being axially aligned and in fluid communication with both said output port and one of said plurality of boreholes and having a cross-sectional area coextensive therewith, with said reception channel being in fluid communication with said input port.

11. The assembly as recited in claim 10 wherein said support further includes a recessed region disposed in said first surface, said recessed region including a sidewall extending from said first surface, toward said second surface and terminating in a recessed surface with said plurality of boreholes extending between said recessed surface and said second surface, with said W-seal manifold being disposed within said recessed region.

12. The assembly as recited in claim 11 said baffle plate further includes an annular protrusion surrounding said recessed area and a plurality of bulwarks spaced-apart from said annular protrusion, with said protrusion and said plurality of bulwarks extending from said first side and contacting said support, with the remaining regions of said first side being spaced-apart from said support.

13. The assembly as recited in claim 12 wherein said through-way is disposed radially and symmetrically about an axis, with said support further including a radical through-port extending between said first and second opposed surfaces and spaced apart from said axis.

14. A lid assembly for semiconductor processing system, comprising:

means for forming a first path over which process fluids travel along a first direction, defining a flow of fluid;

means, connected to said means for forming, for dispersing said flow of fluid to propagate over a plane away from said path, with said plane extending transversely to said first direction, defining a dispersed flow; and means, connected to said means for forming, for creating a second path, disposed spaced apart from said first path to move said dispersed flow along said first direction.

15. The assembly as recited in claim 14 wherein said means for forming a first path includes a support having first and second opposed surfaces with a plurality of boreholes extending therebetween, and plurality of valves coupled to said first surface, each of which includes an output port in fluid communication with one of said plurality of boreholes.

16. The assembly as recited in claim 15 wherein said means for forming a first path further includes a W-seal manifold disposed between said plurality of valves and said support, with said W-seal manifold including a plurality of injection channels each of which is axially aligned and in fluid communication with both said output port and one of said plurality of boreholes and having a cross-sectional area coextensive therewith.

17. The assembly as recited in claim 16 wherein said support further includes a recessed region disposed in said first surface, said recessed region including a sidewall extending from said first surface, toward said second surface and terminating in a recessed surface with said plurality of boreholes extending between said recessed surface and said second surface, with said W-seal manifold being disposed within said recessed region.

18. The assembly as recited in claim 14 wherein said means for dispersing said flow of fluid includes a baffle plate mounted to said second surface, said baffle plate including first and second opposed sides with said first side being superimposed by said plurality of boreholes.

19. The assembly as recited in claim 18 wherein said baffle plate further includes first and second opposed sides with a throughway extending therebetween, with said means for creating a second path further including positioning said throughway to lie outside of said path.

20. The assembly as recited in claim 19 wherein said baffle plate further includes a recessed area extending from said first side and terminating in a nadir region having said throughway formed therein extending between said nadir region and said second surface, defining an annular nadir surface, with said plurality of boreholes superimposing said annular nadir surface.

21. The assembly as recited in claim 20 wherein said baffle plate further includes an annular protrusion surrounding said recessed area and a plurality of bulwarks spaced-apart from said annular protrusion, with said protrusion and said plurality of bulwarks extending from said first side and contacting said means for forming a first path, with the remaining regions of said first side being spaced-apart from said means for forming a first path.

22. A lid assembly for a semiconductor processing system, comprising:

a support having first and second opposed surfaces and a plurality of holes disposed therethrough;

a plurality of valves coupled to the first surface of the support, wherein each valve of the plurality of valves has an outlet that is connected to one of the plurality of holes;

a baffle plate coupled to the second surface of the support, wherein the baffle plate has one throughway that provides a single outlet into the semiconductor processing system for all of the outlets of the plurality of valves.

23. The lid assembly of claim 22, wherein the throughway in the baffle plate is in a recessed area of the baffle plate.

24. The lid assembly of claim 22, wherein each of the valve outlets superimposes the throughway of the baffle plate.

25. The lid assembly of claim 22, wherein the baffle plate is coupled to the second surface of the support via protrusions on the baffle plate such that the remaining regions of the baffle plate are spaced apart from the second surface of the support.

26. The lid assembly of claim 22, wherein the plurality of holes extend from a recessed region in the first surface of the support to the second surface of the support.

27. The lid assembly of claim 26, wherein a W-seal manifold is disposed in the recessed region.

28. The lid assembly of claim 22, wherein a W-seal manifold is mounted between the plurality of valves and the support.

* * * * *